(12) United States Patent
Ulrich et al.

(10) Patent No.: US 10,243,614 B1
(45) Date of Patent: Mar. 26, 2019

(54) METHOD AND SYSTEM FOR CALIBRATING MULTI-WIRE SKEW

(71) Applicant: Kandou Labs, S.A., Lausanne (CH)

(72) Inventors: Roger Ulrich, Bern (CH); Armin Tajalli, Salt Lake City, UT (US); Ali Hormati, Ecublens (CH); Richard Simpson, Bedford (GB)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 15/881,512

(22) Filed: Jan. 26, 2018

(51) Int. Cl.
*H04B 3/00* (2006.01)
*H04B 3/462* (2015.01)

(52) U.S. Cl.
CPC .................................. *H04B 3/462* (2013.01)

(58) Field of Classification Search
CPC ... H04L 25/08; H04L 25/03006; H04L 25/49; H04L 25/03; H04L 25/06; H04L 25/03057; H04L 25/085; H04B 17/364; H04B 3/00; H04B 3/02; H04B 3/462; H04B 5/0031
USPC .................. 375/219, 220, 221, 222, 240, 211
See application file for complete search history.

(56) References Cited

U.S. PATENT DOCUMENTS

| | | |
|---|---|---|
| 6,854,030 B2 | 2/2005 | Perino |
| 7,085,336 B2 | 8/2006 | Lee |
| 7,145,411 B1 | 12/2006 | Blair |
| 7,336,139 B2 | 2/2008 | Blair |
| 7,366,942 B2 | 4/2008 | Lee |
| 8,539,318 B2 | 9/2013 | Cronie |
| 8,593,305 B1 | 11/2013 | Tajalli |
| 8,649,445 B2 | 2/2014 | Cronie |
| 8,718,184 B1 | 5/2014 | Cronie |
| 8,755,426 B1 | 6/2014 | Cronie |
| 8,782,578 B2 | 7/2014 | Tell |
| 8,989,317 B1 | 3/2015 | Holden |
| 9,015,566 B2 | 4/2015 | Cronie |
| 9,071,476 B2 | 6/2015 | Fox |
| 9,077,386 B1 * | 7/2015 | Holden ............... H04L 25/4925 |
| 9,100,232 B1 | 8/2015 | Hormati |
| 9,124,557 B2 | 9/2015 | Fox |
| 9,246,713 B2 | 1/2016 | Shokrollahi |
| 9,288,082 B1 | 3/2016 | Ulrich |
| 9,288,089 B2 | 3/2016 | Cronie |
| 9,300,503 B1 * | 3/2016 | Holden ............... H04L 25/4925 |
| 9,319,218 B2 | 4/2016 | Pandey |
| 9,362,974 B2 | 6/2016 | Fox |

(Continued)

*Primary Examiner* — Siu M Lee
(74) *Attorney, Agent, or Firm* — Invention Mine LLC

(57) ABSTRACT

Methods and systems are described for receiving, over a plurality of consecutive signaling intervals, a plurality of codewords, each codeword received as a plurality of symbols via wires of a multi-wire bus, the plurality of symbols received at a plurality of multi-input comparators (MICs), wherein each symbol is received by at least two MICs, generating, for each codeword, a corresponding linear combination of the received symbols, generating a plurality of composite skew measurement signals over the plurality of consecutive signaling intervals, each composite skew measurement signal based on samples of one or more linear combinations, and updating wire-specific skew values of the wires of the multi-wire bus, wherein one or more wire-specific skew values are updated according to composite skew measurement signals associated with linear combinations formed by at least two different MICs.

20 Claims, 13 Drawing Sheets

(56) References Cited

U.S. PATENT DOCUMENTS

| | | |
|---|---|---|
| 9,363,114 B2 | 6/2016 | Shokrollahi |
| 9,401,828 B2 | 7/2016 | Cronie |
| 9,432,082 B2 | 8/2016 | Ulrich |
| 9,444,654 B2 | 9/2016 | Hormati |
| 9,461,862 B2 | 10/2016 | Holden |
| 9,479,369 B1 | 10/2016 | Shokrollahi |
| 9,509,437 B2 | 11/2016 | Shokrollahi |
| 9,667,379 B2 | 5/2017 | Cronie |
| 9,825,723 B2 * | 11/2017 | Holden ............... H04L 25/4925 |
| 2001/0055344 A1 | 12/2001 | Lee |
| 2003/0046618 A1 | 3/2003 | Collins |
| 2005/0134380 A1 | 6/2005 | Naim |
| 2007/0103338 A1 | 5/2007 | Teo |
| 2011/0156757 A1 | 6/2011 | Hayashi |
| 2011/0268225 A1 | 11/2011 | Cronie |
| 2011/0299555 A1 | 12/2011 | Cronie |
| 2011/0302478 A1 | 12/2011 | Cronie |
| 2012/0213299 A1 | 8/2012 | Cronie |
| 2013/0010892 A1 | 1/2013 | Cronie |
| 2014/0177645 A1 | 6/2014 | Cronie |
| 2014/0254642 A1 | 9/2014 | Fox |
| 2015/0222458 A1 | 8/2015 | Hormati |
| 2015/0249559 A1 | 9/2015 | Shokrollahi |
| 2015/0333940 A1 | 11/2015 | Shokrollahi |
| 2015/0349835 A1 | 12/2015 | Fox |
| 2015/0381768 A1 | 12/2015 | Fox |
| 2016/0020796 A1 | 1/2016 | Hormati |
| 2016/0020824 A1 | 1/2016 | Ulrich |
| 2016/0036616 A1 * | 2/2016 | Holden ............... H04L 27/2637 375/260 |
| 2016/0380787 A1 * | 12/2016 | Hormati ............ H04L 25/03885 375/233 |
| 2017/0317449 A1 | 11/2017 | Shokrollahi |
| 2017/0317855 A1 | 11/2017 | Shokrollahi |

\* cited by examiner

METHOD AND SYSTEM FOR CALIBRATING MULTI-WIRE SKEW

REFERENCES

The following prior applications are herein incorporated by reference in their entirety for all purposes:

U.S. Patent Publication 2011/0268225 of application Ser. No. 12/784,414, filed May 20, 2010, naming Harm Cronie and Amin Shokrollahi, entitled "Orthogonal Differential Vector Signaling" (hereinafter [Cron I]).

U.S. patent application Ser. No. 13/842,740, filed Mar. 15, 2013, naming Brian Holden, Amin Shokrollahi and Anant Singh, entitled "Methods and Systems for Skew Tolerance in and Advanced Detectors for Vector Signaling Codes for Chip-to-Chip Communication", hereinafter identified as [Holden I];

U.S. patent application Ser. No. 14/926,958, filed Oct. 29, 2015, naming Richard Simpson, Andrew Stewart, and Ali Hormati, entitled "Clock Data Alignment System for Vector Signaling Code Communications Link", hereinafter identified as [Simpson I].

U.S. patent application Ser. No. 14/717,717, filed May 20, 2015, naming Richard Simpson and Roger Ulrich, entitled "Control Loop Management and Differential Delay Detection and Correction for Vector Signaling Code Communications Links", hereinafter identified as [Simpson II].

U.S. patent application Ser. No. 14/253,584, filed Apr. 15, 2014, naming John Fox, Brian Holden, Ali Hormati, Peter Hunt, John D Keay, Amin Shokrollahi, Anant Singh, Andrew Kevin John Stewart, Giuseppe Surace, and Roger Ulrich, entitled "Methods and Systems for High Bandwidth Communications Interface" (hereinafter called [Fox I])

U.S. patent application Ser. No. 14/315,306, filed Jun. 25, 2014, naming Roger Ulrich, entitled "Multilevel Driver for High Speed Chip-to-Chip Communications" (hereinafter called [Ulrich I]);

U.S. patent application Ser. No. 13/895,206, filed May 15, 2013, naming Roger Ulrich and Peter Hunt, entitled "Circuits for Efficient Detection of Vector Signaling Codes for Chip-to-Chip Communications using Sums of Differences", hereinafter identified as [Ulrich II].

U.S. patent application Ser. No. 15/641,313, filed Jul. 4, 2017, naming Roger Ulrich, Armin Tajalli, Ali Hormati, and Richard Simpson, entitled "Method for Measuring and Correcting Multi-Wire Skew", hereinafter identified as [Ulrich III].

U.S. patent application Ser. No. 15/582,545, filed Apr. 28, 2017, 2014, naming Ali Hormati and Richard Simpson, entitled "Clock Data Recovery Utilizing Decision Feedback Equalization" (hereinafter called [Hormati I]);

U.S. Provisional Patent Application No. 62/464,597, filed Feb. 28, 2017, naming Ali Hormati and Kiarash Gharibdoust, entitled "Method for Measuring and Correcting Multiwire Skew" (hereinafter called [Hormati II]).

U.S. Provisional Patent Application No. 62/509,714, filed May 22, 2017, naming Armin Tajalli and Ali Hormati, entitled "Multi-modal Data-driven Clock Recovery Circuit" (hereinafter called [Tajalli I]).

U.S. Pat. No. 9,100,232, issued Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi I].

FIELD OF THE INVENTION

The present embodiments relate to communications systems circuits generally, and more particularly to measurement and reduction of differential signal arrival times for a received communications signal transmitted over a high-speed multi-wire interface used for chip-to-chip communication.

BACKGROUND

In modern digital systems, digital information is processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods, referred to herein as non-return-to-zero or NRZ signaling. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals, typically communicated essentially in parallel over multiple wires or communications channels, from the transmitter to one or more receivers. At a receiver, the received signals corresponding to the codeword are transformed back into the original digital information representation space. Herein, this process is referred to as "decoding".

Regardless of the encoding method used, the received signals presented to the receiving device are sampled (or their signal value otherwise recorded) at intervals best representing the original transmitted values, regardless of transmission channel delays, interference, and noise. The timing of this sampling or slicing operation is controlled by an associated Clock and Data Alignment (CDA) timing system, which determines the appropriate sample timing. Where the group of signals is communicated essentially in parallel over multiple wires or communications channels, variations in propagation delay over the multiple wires or channels can cause elements comprising one group of signals or codeword to be received at different times. This "skew" may, if uncorrected, prevent codewords from being received as coherent entities, and thus thwart decoding.

BRIEF DESCRIPTION

To reliably detect the data values transmitted over a communications system, a receiver accurately measures the received signal value amplitudes at carefully selected times. For vector signaling codes communicated essentially in parallel, this timing selection is comprised of two parts: accurate sampling of individual codeword elements received on individual wires or communications channels, and accurate interpretation of the entire received codeword, regardless of timing variations in reception of its component elements.

These differential propagation times across the vector signaling code codeword may be caused by variations in transmission path length or propagation velocity, and may be constant or vary over time. Identifying and correcting such differential arrival times or "skew" will increase the timing window for proper reception, thus improving received signal quality. Accurately measuring skew at the receiver is essential to subsequent skew correction, which as one example may be performed by introducing variable delays into the individual wire or symbol data paths prior to codeword decoding.

Methods and systems are described for receiving, over a plurality of consecutive signaling intervals, a plurality of codewords, each codeword received as a plurality of symbols via wires of a multi-wire bus, the plurality of symbols received at a plurality of multi-input comparators (MICs), wherein each symbol is received by at least two MICs, generating, for each codeword, a corresponding linear combination of the received symbols, generating a plurality of composite skew measurement signals over the plurality of consecutive signaling intervals, each composite skew measurement signal based on samples of one or more linear combinations, and updating wire-specific skew values of the wires of the multi-wire bus, wherein one or more wire-specific skew values are updated according to composite skew measurement signals associated with linear combinations formed by at least two different MICs.

DETAILED DESCRIPTION

As described in [Cronie I], vector signaling codes may be used to produce extremely high bandwidth data communications links, such as between two integrated circuit devices in a system. Multiple data communications channels transmit symbols of the vector signaling code, acting together to communicate codewords of the vector signaling code. Depending on the particular vector signaling code used, the number of channels comprising a communications link may range from two to eight or more. Individual symbols, e.g. transmissions on any single communications channel, may utilize multiple signal levels, often three or more.

Embodiments may also apply to any communication or storage methods requiring coordination of multiple channels or elements of the channel to produce a coherent aggregate result.

Input Sampling Circuits

Conventional practice for a high-speed integrated circuit receiver includes terminating each data line (after any relevant front end processing such as amplification and frequency equalization) in a sampling device. This sampling device performs a measurement constrained in both time and amplitude dimensions; in one example embodiment, it may be comprised of a sample-and-hold circuit that constrains the time interval being measured, followed by a threshold detector or digital comparator that determines whether the signal within that interval falls above or below (or in some embodiments, within bounds set by) a reference value. In another embodiment, it may be comparable to an edge-triggered flip-flop, sampling the state of its input in response to a clock transition. Subsequently, this document will use the term sampling device, or more simply "sampler" to describe this receiver input measurement function as it implies both the time and amplitude measurement constraints, rather than the equivalent but less descriptive term "slicer" synonymously used in the art.

Figure 11:
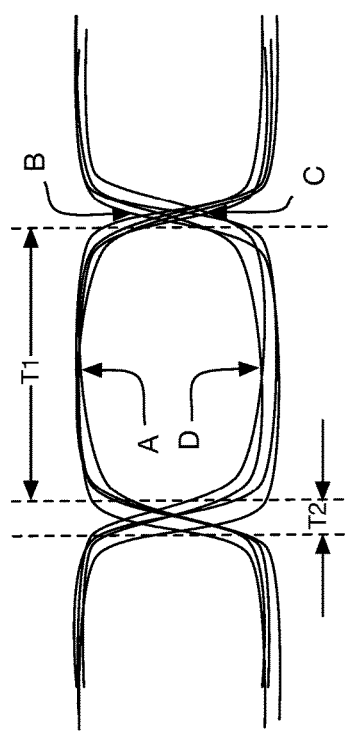
FIG. 11 is a diagram of a receiver eye plot illustrating center-of-the-eye sampling.

The receiver "eye plot" as illustrated in FIG. 11 graphically illustrates input signal values that will or will not provide accurate and reliable detected results from such measurement, and thus the allowable boundaries of the time and amplitude measurement windows imposed on the sampler.

A Clock Data Alignment or CDA circuit supports such sampling measurements by extracting timing information, either from the data lines themselves or from dedicated clock signal inputs, and utilize that extracted information to generate clock signals to control the time interval used by the data line sampling device(s). The actual clock extraction may be performed using well known circuits such as a Phase Locked Loop (PLL) or Delay Locked Loop (DLL), which in their operation may also generate higher frequency internal clocks, multiple clock phases, etc. in support of receiver operation. These sampling clocks are "aligned" with the data to be sampled to optimize the quality and accuracy of the sampled results, typically by configuring the CDA so that sampling occurs when the signal to be sampled is stable, the so-called "center of eye" timing intervals identified by A and D in FIG. 11.

System Environment

Figure 1:
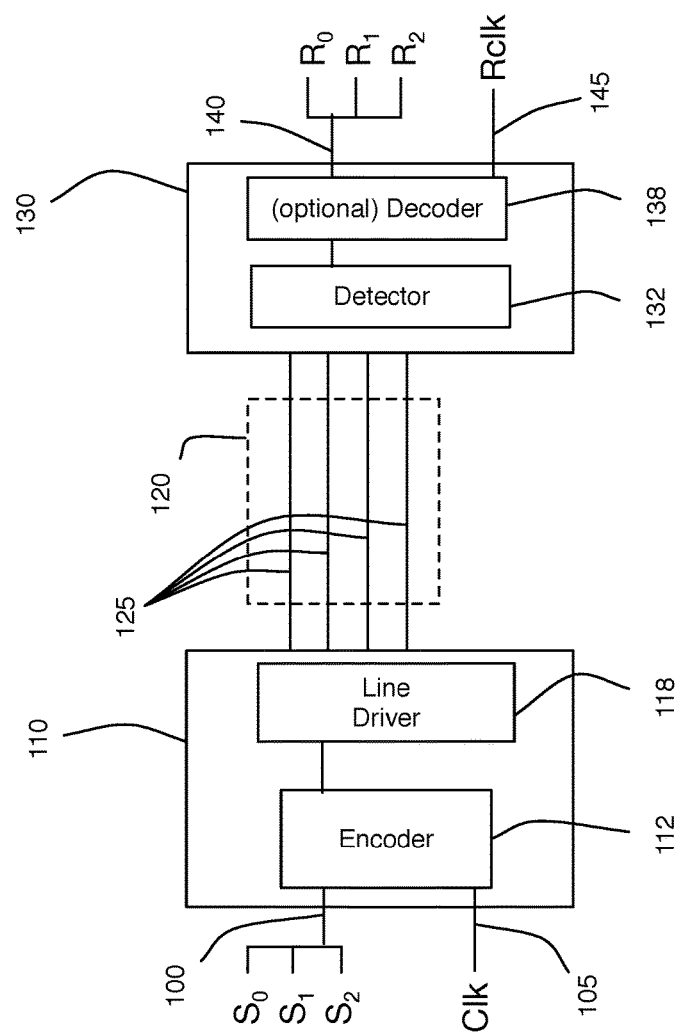
FIG. 1 shows a system with a transmitter 110 communicating over channel 120 comprising a multi-wire bus having multiple wires 125 to receiver 130.

FIG. 1 illustrates an exemplary system, in accordance with some embodiments. As shown, FIG. 1 includes a transmitter 110 that receives source data $S_0$-$S_2$ 100 and Clk 105, and an encoder 112 that encodes the information for transmission over a channel 120 including a multi-wire bus having multiple wires 125 via line driver 118. FIG. 1 further includes a receiver 130 including a detector 132 and in some embodiments includes a decoder 138, if needed, for producing receive data $R_0$-$R_2$ 140 and a receive clock Rclk 145.

For purposes of description and without implying limitation, the following examples assume a communications system environment comprising interconnection of one transmitting and one receiving integrated circuit device via four wires of essentially equal path length and transmission line characteristics, at a signaling rate of 25 Gigabit/second/wire, equivalent to a transmission unit interval of 40 picoseconds. The Hadamard 4×4 vector signaling code of [Cronie I], also called [Fox I] the Enhanced NRZ or ENRZ code, is used to communicate three data values (each carried by a sub-channel of the vector signaling code, as subsequently described) over four wires, with a receive clock derived from transitions of the received data values. Other embodiments may include interconnection of one transmitting and one receiving integrated circuit device via six wires of essentially equal path length and transmission line characteristics, at a signaling rate of 25 Gigabit/second/wire, equivalent to a transmission unit interval of 40 picoseconds. The Glasswing vector signaling code of [Shokrollahi I], also called the 5b6w, Chord NRZ or (CNRZ) code, is used to communicate five data values (each carried by a sub-channel of the vector signaling code, as subsequently described) over six wires, with a receive clock derived from transitions of the received data values.

It is assumed known methods for transmission pre-emphasis such as using Finite Impulse Response filtering, and receiver Continuous Time Linear Equalization (CTLE) and Decision Feedback Equalization (DFE) will be incorporated to provide adequate receiver signal quality.

Example communications channels may include skew, such as might be induced by variations in printed circuit board composition or wire routing, but for descriptive purposes the magnitude of this skew is assumed to be less than one unit interval. Embodiments correcting that amount of skew will in general address maximization of horizontal eye opening in a system in which the eyes are already partially open. Other embodiments may utilize the training sequences and methods described in [Hormati II] to achieve open eyes in a channel with larger amounts of skew, and further embodiments combining the described skew corrections with other known skew correction methods may be applied to environments with substantially greater amounts of skew, thus no limitation is implied.

Figure 2:
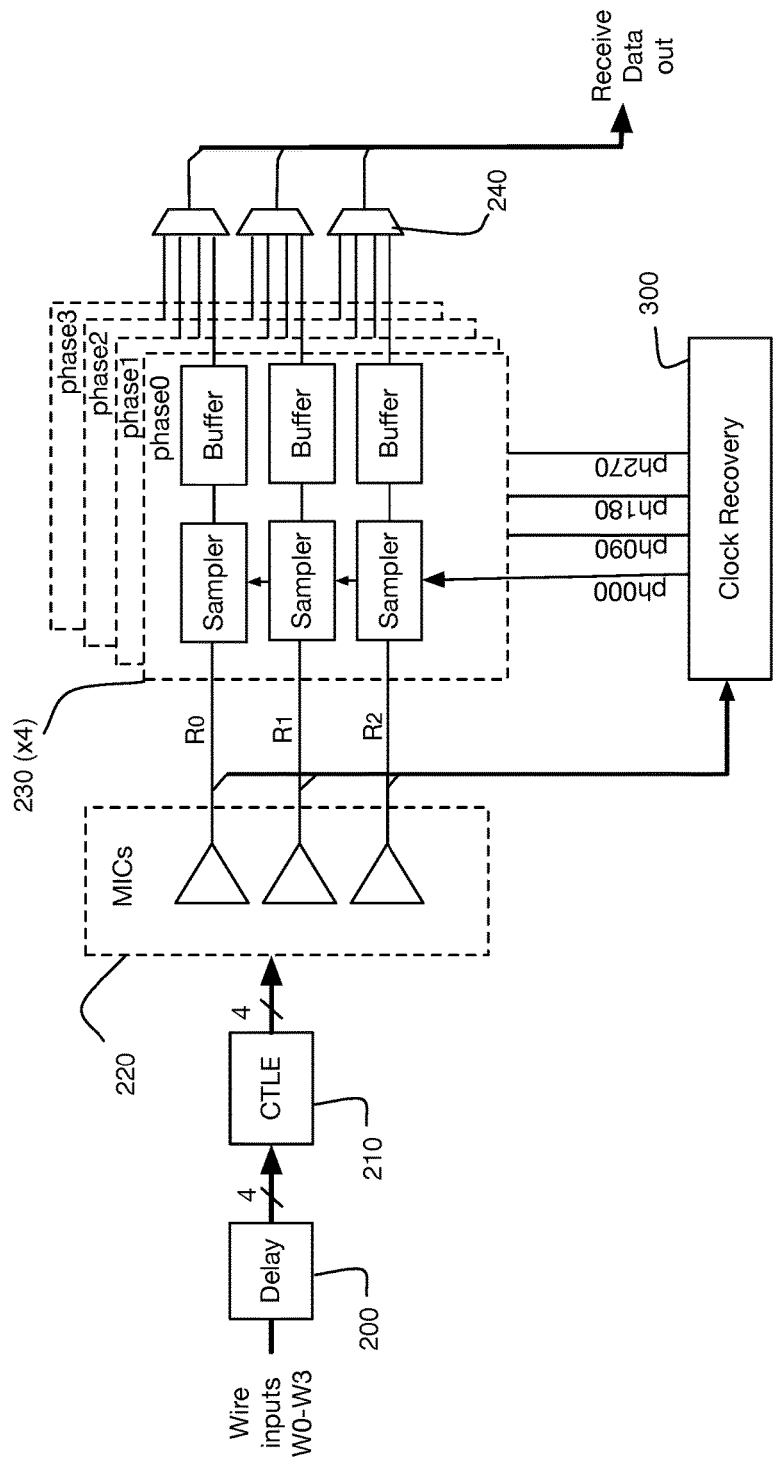
FIG. 2 illustrates one embodiment of a receiver for the ENRZ code utilizing receive clocks derived from received data transitions.

One example embodiment of a communications receiver for vector signaling code is shown in FIG. 2. In that block diagram, four data wire inputs W0 through W3 from the multi-wire bus are each processed by a delay element 200, the resulting signals then passed to Continuous Time Linear Equalizers (CTLE) 210 for optional amplification and/or frequency compensation. It is also common for CTLE circuits to be configured to provide additional high-frequency gain (also known as high frequency "peaking") to compensate for frequency-dependent transmission medium losses. The resulting processed wire signals are presented to Multi-input comparators (MICs) 220, which decode the sub-channels of the vector signaling code MIC0-MIC2. These sub-channel outputs are sampled via sampling circuits 230 at time intervals determined by Clock Recovery (CDA) subsystem 300, producing sub-channel 1-3 data outputs. As shown in FIG. 2, the receiver may operate in multiple phases and may include multiplexors 240 to sequentially output the sampled data for each phase. In an alternative embodiment, processing by delay element 200 occurs after CTLE 210 and before MIC 220.

Figure 4:
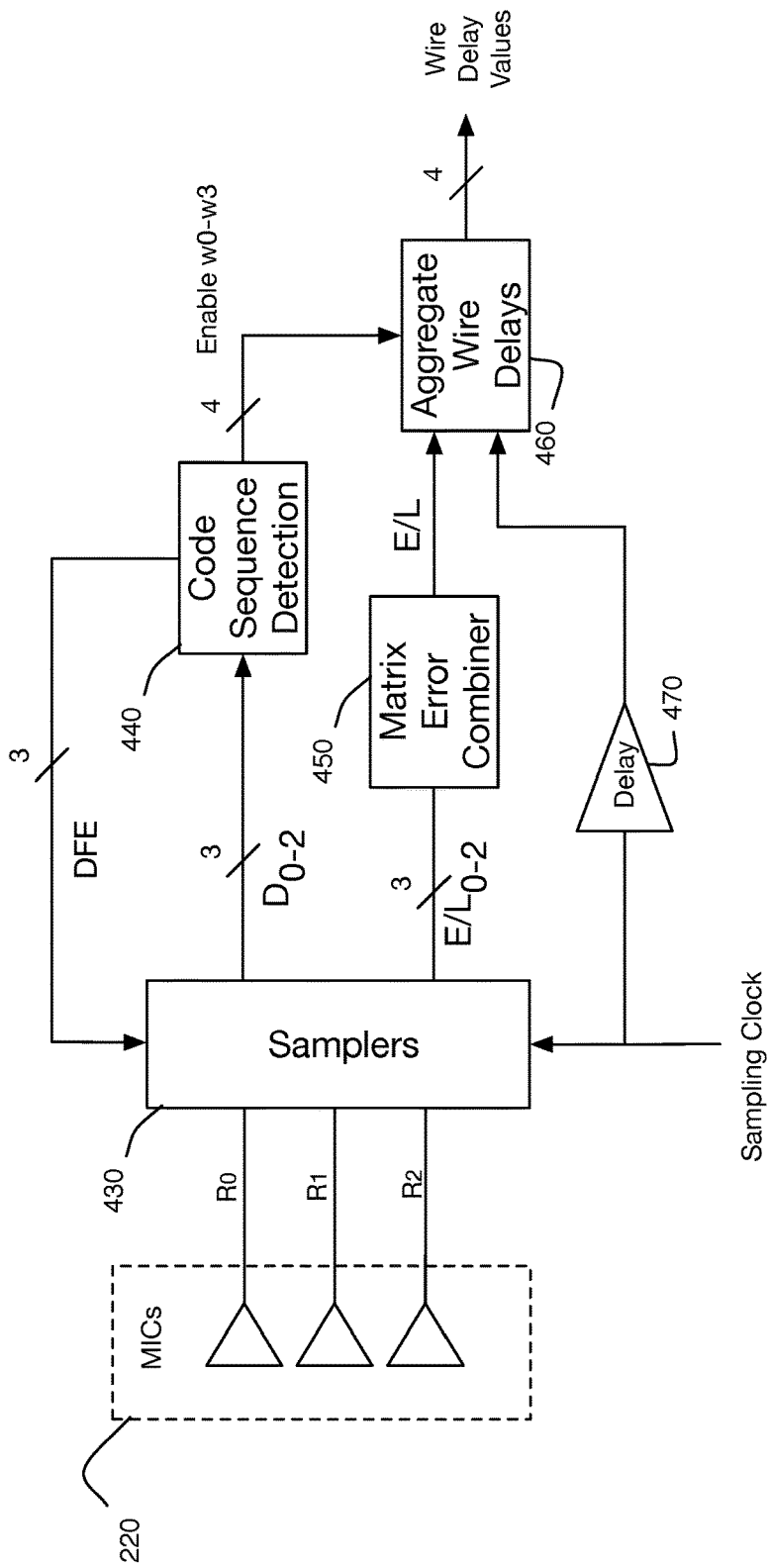
FIG. 4 is a block diagram of a skew detection system, in accordance with some embodiments.

In some embodiments, an apparatus includes a plurality of multi-input comparators (MICs) 220 configured to receive a plurality of codewords over a plurality of signaling intervals, each codeword received at the plurality of MICs as a plurality of symbols, each MIC configured to generate a corresponding linear combination for each received codeword. A skew correction circuit, an example of which is shown in FIG. 4, is configured to generate a plurality of composite skew measurement signals, each composite skew measurement signal formed based on one or more linear combinations generated in a single signaling interval of the plurality of signaling intervals. The linear combinations are generated by the MICs 220 forming a combination of the received symbols of the codeword. A plurality of wire-specific delay elements 200 are configured to store wire-specific delay values, each wire-specific delay value connected to a single wire of the multi-wire bus and to store a wire-specific delay value associated with said single wire, wherein one or more wire-specific delay elements are updated using composite skew measurement signals associated with linear combinations formed by at least two MICs during the plurality of signaling intervals.

In some embodiments, at least one of the plurality of composite skew measurement signals includes wire-specific skew components from all wires connected to a given MIC. In some embodiments, at least one of the plurality of composite skew measurement signals is generated based on linear combinations generated by at least two MICs.

Ins some embodiments, the apparatus further includes a code sequence detection circuit 440 configured to identify a valid codeword sequence, and wherein the plurality of wire-specific delay elements is updated in response to the identification of the valid codeword sequence. In some such embodiments, the code sequence detection circuit is further configured to identify a subset of wires associated with the valid codeword sequence.

In some embodiments, a wire-specific skew value of a given wire is updated in response to a subset of the composite skew measurement signals generated over the plurality of consecutive unit intervals exceeding an action threshold.

In some embodiments, each MIC is configured to implement the corresponding linear combination defined by a respective sub-channel vector of a plurality of mutually orthogonal sub-channel vectors. Examples of linear combinations based on sub-channel vectors are given below in Eqns. 2-4.

In some embodiments, the wire-specific delay elements are configured to adjust wire-specific delay values of a given wire by adjusting a capacitance associated with the given wire. In some such embodiments, the wire-specific delay element comprises a switched-capacitor network connected to the given wire.

In some embodiments, the samples of the one or more linear combinations are compared to a pre-determined offset voltage, and the composite skew measurement signal represents an early-late indication signal.

Figure 6:
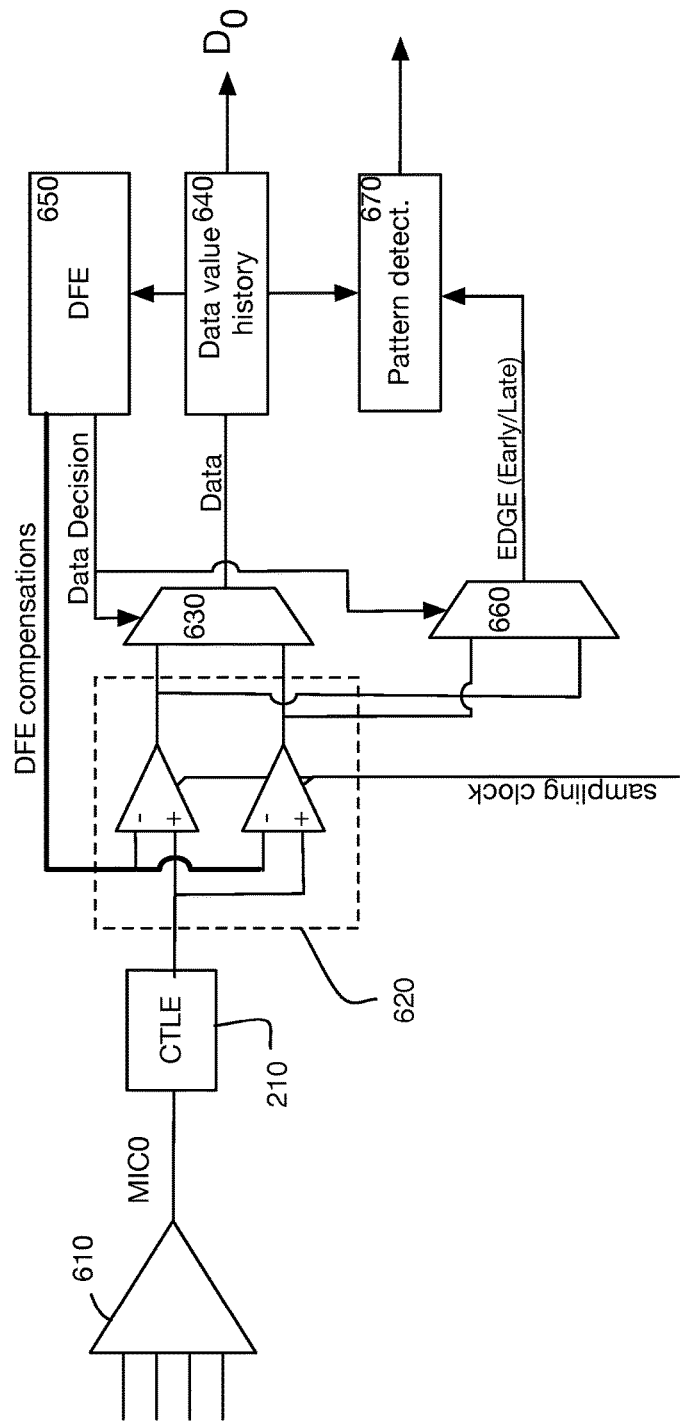
FIG. 6 is a block diagram of an exemplary sampler that may be used to provide data decisions and early/late indications, in accordance with some embodiments.

In some embodiments, additional samplers are provided for some or all sub-channel outputs, to facilitate timing analysis and/or management. As one example, such an additional sampler may be triggered using an earlier or later clock to detect signal transitions and thus optimize CDA operation. As another example, such an additional sampler may be configured with an adjustable offset slicer voltage, to facilitate measurement of vertical eye opening. The slicer offset voltages may additionally incorporate DFE correction factors to provide both data and clock edge information, as described in [Hormati I] and in FIG. 6. FIG. 6 includes at least one stage of speculative DFE 650 supported by two data samplers performing concurrent time-sampling operations at two different amplitude thresholds. As shown, the data samplers include comparators 620 generating comparator output slicing the signal received from CTLE 210 and sampling the comparator output according to the sampling clock. One comparator output is chosen as the data value D and the other is chosen as an error signal in the form of an early late indicator, according to the most recent data decision. This signal is referred to herein as a signal skew characteristic. Using data value history 640, a pattern detection block 670 may identify patterns having transitions, and responsively use the skew measurement signal (shown as an early/late indication E/L) to identify wires involved in the transition and to responsively increment or decrement a corresponding wire-specific counter. Such selections of the data signal and early/late skew measurement signal may be performed using multiplexors 630 and 660. [Tajalli I] additionally describes how clock edge information from two or more sub-channels may be combined, and how skew measurement information from sub-channels not experiencing a transition may be filtered from such combined results, providing improved timing feedback to the CDA subsystem.

Figure 7:
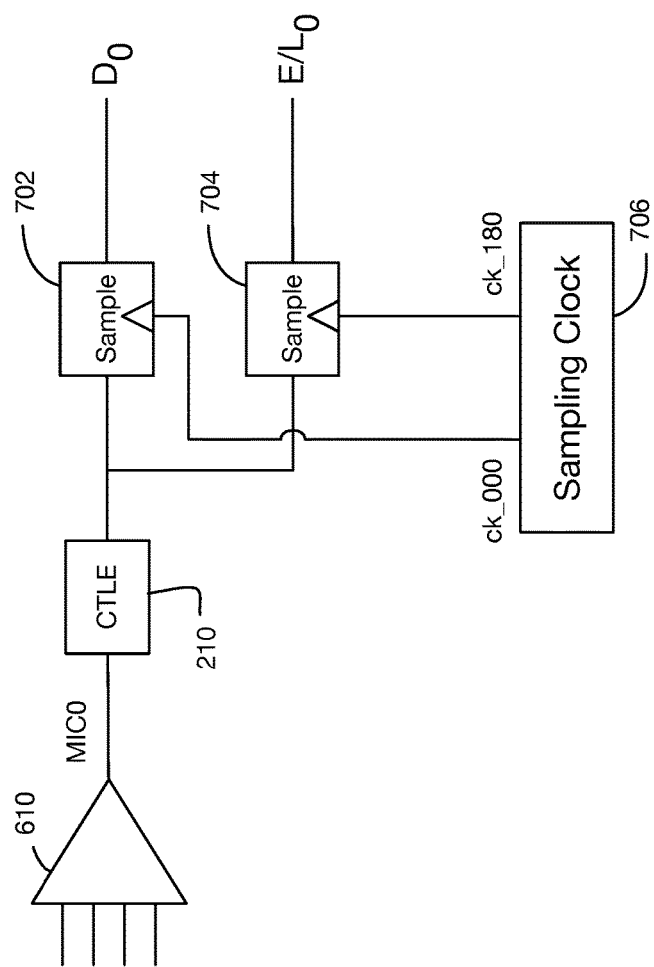
FIG. 7 is a block diagram of an alternative sampler that may be used to provide data decisions and early/late indications, in accordance with some embodiments.

FIG. 7 illustrates an alternative sampling mechanism that may be used in some embodiments. As shown, the output of MIC0 610 is processed by CTLE 210 as above, the output of which is sampled according to data sampler 702 and transition sampler 704. In such embodiments, the data signal from CTLE 210 may be sampled at a double rate. In at least one embodiment, the data may be sampled twice according to sampling clocks ck_000 and ck_180 provided by sampling clock block 706. In some embodiments, the 180 degree out-of-phase clocks may be used in which one clock samples "middle of the eye" (see FIG. 11), while the other is used to sample the transition regions to obtain an early/late indication as a composite skew measurement signal. Alternatively, a full rate clock may be used while data is transmitted twice, effectively halving the data rate. In such embodiments, only one sampler may be used, the output of which alternates between a data sample and an edge sample. In such embodiments, a full-rate data transmission may be initiated or resumed after the half-rate skew training period has been completed. Further measurements and adjustments made then be performed using the full-rate methods and circuits described herein.

Differential arrival times or "skew" of the various wire signals may delay or interfere with proper detection of the vector signaling code. This skew may be caused by variations in transmission path element length or propagation velocity, and may be constant or vary over time. Thus, accurately measuring skew at the receiver is helpful for subsequent skew correction, which as one example may be performed by introducing variable delays into the individual symbol data paths prior to codeword decoding. In another example, measured skew values may be conveyed back to the transmitter where wire-specific timing adjustments may be made to pre-compensate for skew as seen by the receiver.

Skew Adjustment and Compensation

Skew elimination includes incrementally offsetting individual wire signals in time to compensate for arrival time variations. Some methods for skew measurement, as one example, that of [Hormati II], also uses interactive adjustment of wire delays as part of their test and analysis procedure.

At the receiver, wire delay embodiments may incorporate known art methods in either the analog or digital domain utilizing variable delay elements, time adjustable sample-and-hold elements, adjustable FIFO buffers, etc.

Figure 5:
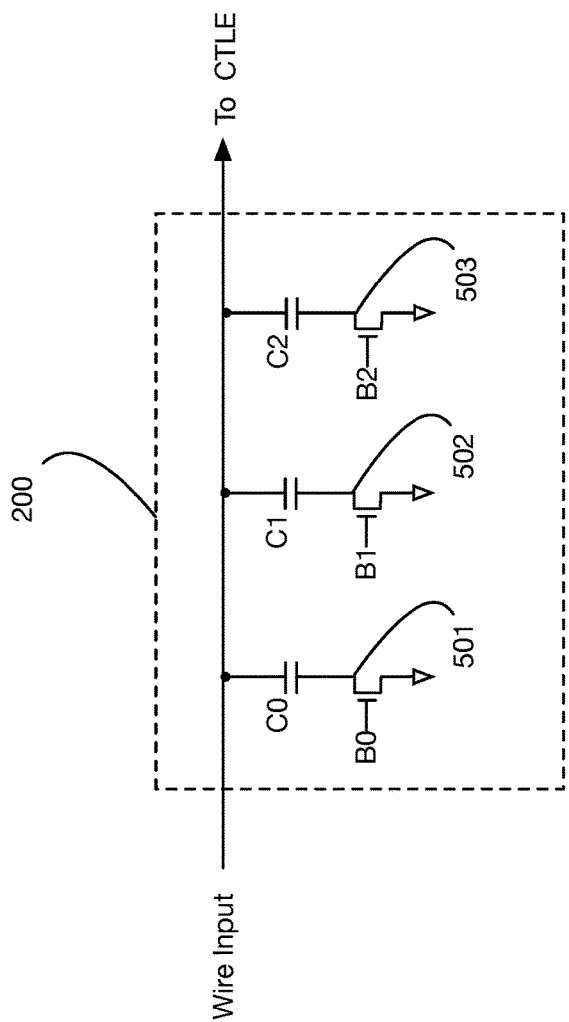
FIG. 5 shows one embodiment of an adjustable delay element for a wire of the multi-wire bus, as used in the receiver of FIG. 2.

[Hormati II] describes a low insertion loss Resistor/Capacitor filter inserted into each received wire signal, which is configurable for introducing small amounts of adjustable delay with minimal impact on signal amplitude. One such embodiment of a delay element 200 is shown in FIG. 5. Shown in the figure is a controllable delay circuit for a single wire, and each wire of the multi-wire bus may be configured with a similar circuit 200 to provide an adjustable amount of signal skew. Transistors 501, 502, and 503 may be enabled respectively by skew control inputs $B_0$, $B_1$, $B_2$ to increase the wire input nodes' capacitance to ground by amounts determined by capacitors $C_0$, $C_1$, $C_2$. This added node capacitance, in association with the source and termination impedances of the incoming transmission line, introduces an increased delay into the wire signal. An alternative embodiment introduces the delay element 200 elsewhere in the wire signal path; as a non-limiting example, at the output of each CTLE stage rather than at the wire inputs of the receiver.

In one particular embodiment, $C_0$, $C_1$, $C_2$ values of 5 fF, 10 fF, 20 fF allows use of a binary skew control codeword that specifies binary increments of capacitance to be added, up to an additional aggregate capacitive value of 35 femto-Farads, corresponding to approximately 5 picoseconds of additional delay. In another embodiment, capacitors of equal value may be used, and the control word is implemented as a thermometer codeword rather than a binary codeword. As a side effect, the added capacitance also slightly degrades high frequency response, with the same embodiment experiencing 1.5 dB degradation in return loss (also generally known as $S_{11}$) at 12.5 GHz, when configured to introduce the maximum 5 psec delay.

Another embodiment capable of greater skew correction samples the wire signals using an analog track-and-hold or sample-and-hold circuit acting as Delay element 200, at skew-modified times during which the individual wire signals are stable, with sampling 140 of the resulting MIC sub-channel outputs using Sampling Clock being deferred by Clock Recovery system 150 until at least the latest of those skew-modified times. Some embodiments may utilize a series of such sampled delay elements per wire to provide increased delay time or reduced sampling signal artifacts.

Skew may also be eliminated by adjusting individual wire transmission times, as described by [Ulrich I]. Such an approach communicates information gathered by the receiver, e.g. relative receive times on the various wires, to the transmitter so that the transmitter may adjust its wire transmission times accordingly. In some embodiments, additional information is communicated permitting variations in communication wire mapping, including transpositions and order reversals, to be identified and corrected. This communication may be driven by the receiver, or may be distributed by a separate command/control processor, in either case communicating over a return data channel, out of band command/control channel, or other communication interface using known art protocols and methods outside the scope of this document.

Receiver Data Detection

As described in [Holden I], vector signaling codes may be efficiently detected by linearly combining sets of input signals using Multi-Input comparators or mixers (MIC). Three instances of such multi-input comparator circuits operating on permutations of the same four input signals are sufficient to detect all code words of ENRZ. That is, given a multi-input comparator that performs the operation $$R=(J+L)-(K+M) \quad \text{(Eqn. 1)}$$

where J, K, L, M are variables representing the four input signals values, then as one example and without limitation, the input permutations producing the three linear combination results $R_0$, $R_1$, $R_2$ based on the equations representative of sub-channel vectors from a Hadamard H4 matrix are:

$$R_0=(W+Y)-(X+Z) \quad \text{(Eqn. 2)}$$

$$R_1=(Y+Z)-(W+X) \quad \text{(Eqn. 3)}$$

$$R_2=(Y+X)-(Z+W) \quad \text{(Eqn. 4)}$$

The above linear combinations are sufficient to unambiguously identify each code word of the ENRZ code as represented by receive signal input values W, X, Y, Z. The results $R_0$, $R_1$, $R_2$ are commonly described as sub-channels of ENRZ, in this example each being modulated by one bit of data.

As taught by [Ulrich II], functionally equivalent MIC configurations may be obtained by refactoring Eqns. 1-4 so that they represent the summation of two differences.

Various methods and systems described herein obtain skew measurements, such as early/late indications, from an aggregate data signal that is formed from a linear combination of data signals on the wires of a multi-wire bus. The aggregate data signals are referred to herein as sub-channel data signals, and are formed using a type of multi-input comparator circuit, or MIC 220, 610. The MIC forms the linear combination by combining the input signals according to the decoder coefficients, or decoder weights, as specified by rows of an orthogonal matrix, such as a Hadamard matrix or other orthogonal matrix as described herein. Thus, each row of the orthogonal matrix defines the elements of the sub-channel codeword, which are then summed to obtain the orthogonal codeword, each element of the orthogonal codeword being a sum of the respective elements of the sub-channel codewords. Depending on the code being used (ENRZ, CNRZ, or another orthogonal code having a plurality of orthogonal sub-channels), all of the wires may be used for each sub-channel data signal (e.g., ENRZ), or the sub-channel data signals may be based on a subset of the wires. In some embodiments, all of the wires may be used for only some of the sub-channel data signals while other sub-channel data signals use a subset of the wires (e.g., CNRZ).

In each type of MIC used to decode a sub-channel by combining wire signals, any signal skew that is present on the wires of the particular sub-channel data signal under consideration will be present to one degree or another in the aggregate sub-channel data signal itself. The degree to which the wire-specific skew affects the given MIC sub-channel output depends on a number of factors, including at least the signal level transition occurring on the corresponding wire, and the relative magnitude that is applied to the signal on that wire (as specified by the sub-channel row of the matrix, and hence the MIC circuit structure). While the MIC is a voltage domain linear combiner, it acts as a phase interpolator when used to extract timing information. The measured skew of the sub-channel output of the MIC, often in the form of an "early/late" determination relative to the receive clock from the CDR subsystem, may then be converted to a composite skew measurement signal that is attributed to the wires involved in the transition and may even be apportioned among the wires according to each wire's relative contribution by taking into account the wire-specific level transitions as well as the corresponding sub-channel decoder coefficients of the MIC. Wire-specific skew offset values may then be generated by accumulating the results of a plurality of skew indicator signals. In some embodiments, the wire specific skew offset values may be generated by determined according to whether the composite skew measurement signals exceed a threshold, or the specific threshold that was exceeded in a given time period.

Because the measured skew is attributed to signal level variations on specific wires, and wire-specific MIC coefficients, either a training pattern with known signal level transitions on known wires may be sent, or the receiver may include a codeword detection circuit to identify what the signal level transitions would have been and the corresponding wires involved in the identified codeword transition(s). Pattern detection circuit 670 may be used to identify specific transitions and the wires involved in the corresponding identified transitions. Thus, the pattern detection circuit 670 may also identify the magnitude of the signal level transitions on the specific wires (according to the codes identified), and may accordingly adjust counter increment values to reflect the relative amount of skew contribution from the respective wires.

In some embodiments, a method comprises: generating, during a first and second signaling interval, an aggregated data signal by forming a linear combination of wire signals received in parallel from wires of a multi-wire bus, wherein at least some of the wire signals undergo a signal level transition during the first and second signaling interval; measuring a signal skew of the aggregated data signal; and, generating wire-specific skew offset values, each wire-specific skew offset value based on the signal skew measurement. That is, if the signal skew measurement is in the form of an early indication, then a counter for a wire involved in the transition may be decremented to decrease the wire-specific skew offset value, and if the signal skew measurement is a late indication, then the counter may be incremented. In some embodiments, the skew measurements correspond to composite skew measurements representing an aggregate combination of individual wire skew components for each wire involved in the transition. In some embodiments, the measurements made on multiple linear combinations produced by two or more MICs may be combined to form a composite skew measurement signal, including the wire-specific skew components of wires associated with the two or more MICs. The final count value may be used as the wire-specific skew offset value(s), or the number of times the count value exceeded a threshold may be used as the wire-specific skew offset value(s). In some embodiments, these wire-specific skew offset values may be used directly as a delay adjustment control signal by adjusting a capacitive loading of the corresponding wire at the receiver. In other embodiments, the values may be sent across a reverse channel to the transmitter, thereby allowing the transmitter to pre-compensate for the skew. In some embodiments, skew offset values may be sent to the transmitter only after a receiver's ability to correct for skew has been reached. That is, once a capacitive loading or other delay mechanism at the receiver has been exhausted, the receiver may communicate a specific wire skew correction to the transmitter. The receiver may then compensate to the adjusted signal from the transmitter, thereby bringing the wire skew back within the range which the receiver may compensate for. The receiver may send specific values of wire-specific skew control signals, or may simply send wire-specific up and down indicators indicating an incremental correction.

In a general characterization of the skew observed from forming linear combinations of wire signals of the wiredline multi-wire bus systems with m MICs, $MIC_i$, $i=0, \ldots, m-1$, each MIC can be described by:

$$MIC_i = \{a_{ij}, r_i\}, j=0, \ldots, n-1 \quad \text{(Eqn. 5)}$$

where n is the number of wires. Here, $a_{ij}$ are the corresponding decoder coefficients, and $r_i$ is the comparison reference level (often set to zero for simplicity). This description can be rewritten as:

$$VMICi = \sum_{j=0}^{n-1} a_{i,j} w_j - r_j \quad \text{(Eqn. 6)}$$

where VMIC stands for the voltage domain operation of a MIC forming a linear combination of inputs. Here, $a_{i,j}$ are real numbers representing MIC coefficients, and $w_j$ are real values corresponding to the instantaneous signal value on each wire. Now if the input wires each have a specific skew, $\Delta t_{w(j)}$, with respect to an arbitrary reference time, then the skew of the signal s(i) at the output of MICi can be estimated by:

$$\Delta t_{s(i)} = \frac{\sum_{j=0}^{n-1} a_{ij} \Delta w_j \Delta t_{w(j)}}{\sum_{j=0}^{n-1} |a_{ij} \Delta w_j|} \quad \text{(Eqn. 7)}$$

where the signal level transition of wire j is given by $\Delta w_j = w_j[\text{now}] - w_j[\text{old}]$, and wherein in some embodiments $-1 \leq \Delta w_j \leq +1$ indicates the normalized magnitude of the transition experienced by signals $w_j$ on wire j ($w_j = 0$ if there is no transition). The voltage swing may be normalized according to the maximum value. As can be seen, the skew at the output of a MIC depends on the data pattern. Hence, it can potentially change between max($t_j$) and min($t_j$), depending on the input data pattern. The data dependent skew at the output of each sub-channel means that even in an ideal system without any ISI, the eye will be closed by max($t_j$)−min($t_j$), due to skew. Skew dependent eye closure does not occur in MICs described by a linear encoding/decoding scheme, such as NRZ, or ENRZ. In some coding schemes such as in CNRZ, skew can close the eye at the output of MIC due to its sensitivity to deterministic or random CM noise.

Here it is assumed that $|t_j| \ll T$ (T is the data period or signaling interval, corresponding to 1×UI). Close to the transition time, the signal value on each wire at time $t \ll T$ can be approximated by:

$$w_j = bj(t+tj) \quad \text{(Eqn. 8)}$$

From (Eqn. 8) and (Eqn. 6), the transition time at the output of sub-channel can be approximated by (Eqn. 7).

Indeed, (Eqn. 7) implies that each MIC is operating as a phase interpolator in the time domain. In other words, the transition time at the output of a MIC stage is a weighted interpolation of the transition times of the input signals. Hence, if a multi-wire receiver can be described with $[a_{ij}, r_i]$, then the cross times at the output of MIC can be described by $[a_{ij} \, b_{ij}]$. If this matrix is invertible, then one can precisely estimate the skew at the input of receiver. Otherwise, if $[a_{ij} \, b_{ij}]$ is not invertible, then it is not possible to calculate the input skew values and an alternative algorithm may be used to make the estimation.

In some embodiments using a GW code, some transmitter implementations exhibit a skew pattern $T=[0, 0, t_1, t_1, t_2, t_2]$, corresponding to wires $W=[w0, \ldots, w5]$. This skew pattern is due to floor-plan of the transmitter. Using Eqn. 7, it can be shown that the expected skew at the output of receiver sub-channels is:

$$T_{subch} = [(t_1+t_2)/3, t_1/2, 0, t_1/2+t_2/2, t_2]. \quad \text{(Eqn. 9)}$$

Based on this calculation, the output of sub-channel five has the maximum skew, while the transition at the output of sub-channel two occurs as the earliest. As depicted in FIG. 15, the experimental data matches very well with the estimation made in Eqn. 9. Hence, Eqn. 9 can be used to estimate the skew between wires ($t_1$ and $t_2$).

In one embodiment, an algorithm to compensate for skew in a system using the GW code may include:
(1) measuring the phase interpolator code (or an alternative signal that can be used to measure the skew between sub-channels) that identifies the crossing point of sub-channel, based on eye of sub-channel (4) (which involves only wires 4 and 5);
(2) make a similar measurement for other sub-channels;
(3) use eq. (9) to estimate the skew corresponding to each wire.

In some embodiments, the measurement algorithm includes measuring the zero crossing points at the output of each Rx sub-channel. The receiver in Rx includes five sub-channels (five MICs). The output of each MIC is sampled by four slicers corresponding to the quarter rate architecture of the receiver (i.e., each slicer operates at one quarter rate, taking turns in processing the full rate aggregate data signal of a given MIC). The procedure of measurement of some embodiments is as follows:
(1) Produce a periodic (e.g., 16 UI data, 8 UI high and 8 UI low) on one of the phases of the transmitter (this assumes a transmitter having multiple phases also).
(2) Measure cross point at the output of the 5 MICs, each one observed by 4 slicers. This gives 20 independent measurements.
(3) Go back to step (1) and transmit a new set of periodic data on a different phase of the transmitter. Repeat this flow until data is collected for all the four phases of the transmitter.

Suppose M0 is measurements that have been carried out corresponding to sub-channel 0. Here, a periodic data sequence has been sent on the transmitter and measured by the receiver slicers. The cross point of the received signal at the output of Rx MICs can be measured. This is done by rotating the sampling clock using a phase interpolator of the four slicers that are connected to each MIC.

M0=[x0+y0+z0  x1+y0+z1  x2+y0+z2  x3+y0+z3
    x0+y1+z3  x1+y1+z2  x2+y1+z3  x3+y1+z0
    x0+y2+z2  x1+y2+z3  x2+y2+z0  x3+y2+z1
    x0+y3+z1  x1+y3+z0  x2+y3+z1  x3+y3+z2]

The columns are measurements that have been done for different phases of the receive clock. For example, the column 0 shows four independent measurements coming out from the slicer of sub-channel zero, which is controlled with phase 000 (0-degree) receive clock. The rows however, refer to four different sets of data that have been transmitted from the transmitter. The row 0, for example, is the periodic data that has been produced by Tx phase 000.

Meanwhile, here:
x: refers to error or skew on Rx sampling clock
y: refers to the error or the skew on the Tx clock that produces the output signal. For example, y0 refers to the timing error on the Tx clock phase 000.
z: refers to the non-linearity effect coming from PI (phase interpolator).

As can be seen, the 16 measurements done at the output of MIC corresponding to sub-channel 0, may be used to calculate (or estimate) 12 independent parameters.

Considering all sub-channels, there will be five sets of measurements for the five MICs, each including 16 measurements, producing 80 individual measurements. Comparing measurements M0, M1, M2, M3, and M4 helps to measure wire to wire skew. In some embodiments, a maximum likelihood approach may be used to extract the following items:
(a) Five inter-wire skew numbers
(b) Inter-phase clock skew numbers for Rx
(c) Inter-phase clock skew numbers for Tx
(d) Four numbers describing nonlinearity of the phase interpolator. Note that the non-linearity numbers for PI can be measured in only few data points.

ENRZ Coding: In some embodiments of an ENRZ scheme, $|a_{ij}|=0.25$, for all i and j values. In some embodiments, the circuit is configured to select specific patterns in order to make measurements for wire skew. Additional embodiments using subsets of transitions in an ENRZ transceiver will be described.

Relationship Between Wires and Codes in ENRZ

As discussed above, and in view of the detection equations Eqns. 2-4, there are difficulties inherent in performing measurements of received sub-channel signals and attempting to map that information back to variations in the received wire signals. Each sub-channel is dependent on all four received wire signals, thus there is no obvious mathematical process to partition, factor out, or otherwise determine information about individual wire signals.

TABLE I

| Code | Wire0 | Wire1 | Wire2 | Wire3 | $R_0$ | $R_1$ | $R_2$ |
|---|---|---|---|---|---|---|---|
| 7 | +1 | −1/3 | −1/3 | −1/3 | 1 | 1 | 1 |
| 1 | −1/3 | +1 | −1/3 | −1/3 | 0 | 0 | 1 |
| 2 | −1/3 | −1/3 | +1 | −1/3 | 0 | 1 | 0 |
| 4 | −1/3 | −1/3 | −1/3 | +1 | 1 | 0 | 0 |
| 0 | −1 | +1/3 | +1/3 | +1/3 | 0 | 0 | 0 |
| 6 | +1/3 | −1 | +1/3 | +1/3 | 1 | 1 | 0 |
| 5 | +1/3 | +1/3 | −1 | +1/3 | 1 | 0 | 0 |
| 3 | +1/3 | +1/3 | +1/3 | −1 | 0 | 1 | 1 |

As shown in Table I, the wire signals used to encode codes 7, 1, 2, 4 utilize a single "+1" signal value and three "−⅓" signal values. (As ENRZ is a balanced vector signaling code, all signal values in a given codeword sum to zero.) Similarly, the wire signals used to encode codes 0, 6, 5, 3 utilize a single "−1" signal and three "+⅓" signals. More significantly, transitions between any of codes 7, 1, 2, 4 or between codes 0, 6, 5, 3 only change the signals on two wires. Thus, if any of, for example, codes 7, 1, 2, 4 is received followed by a different code from that same set, the transition between codes is associated with exactly two wires changing, and which two wires changed may be determined using the information in Table I. Identical conditions apply to consecutive occurrences of codes drawn from the set 0, 6, 5, 3.

These known two-wire transitions are associated with exactly two values changing in the received data "word" $R_0$, $R_1$, $R_2$. Such criterion is not by itself sufficient to identifying which two wires changed, however, as for example a transition between code 7 and code 1 due to changes in Wire0 and Wire1 cause only $R_0$, $R_1$ to change, but so do transitions between codes 0 and 6; Contrariwise, changes of only $R_0$, $R_1$ may also be caused by transitions between codes 2 and 4, or between codes 3 and 5, due to changes in Wire2 and Wire3. Thus, an algorithm or circuit may be used to identify wire pairs associated with sub-channel transitions may identify particular sequential sets of codes. The particular wire order and codeword values used in this example were chosen for descriptive convenience, and in no way imply limitation.

Determining Transition Times

As previously mentioned, the system environment for these descriptions utilizes receiver clock recovery derived from transitions of the detected sub-channel data. To maximize the amount of information available to maintain proper clock alignment, it is common to monitor all received sub-channels. [Tajalli I] describes such a clock recovery system, in which individual phase detectors sensitive to transitions in each sub-channel produce phase error results, which are then summed to produce an aggregate error signal used to update the clock PLL phase. In one such embodiment, only results from sub-channels with valid transitions within the time interval of interest are summed; in an alternative embodiment, simple "bang/bang" phase comparators are used and summed without such filtration, with any anomalous error results produced by non-transitioning sub-channels being averaged out over time. Known art embodiments utilizing either baud-rate clock edge detection methods or double-rate clock edge sampling methods may also be used.

Figure 3:
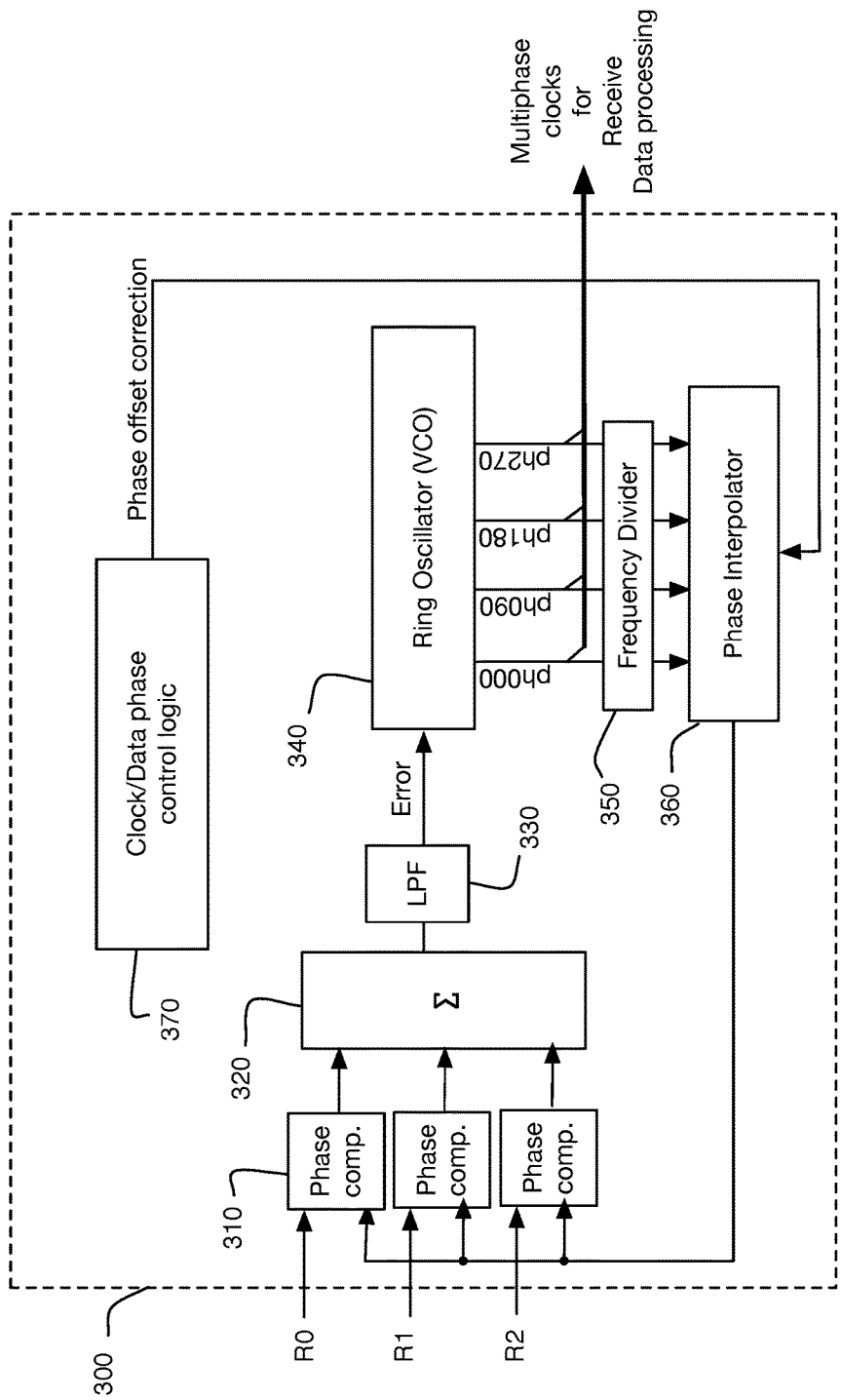
FIG. 3 illustrates one embodiment of a Clock Recovery subsystem as used in the receiver of FIG. 2.

FIG. 3 illustrates a clock recovery circuit 300, for use in some embodiments. As shown, FIG. 3 includes multiple partial phase comparators 310, reach receiving a respective sub-channel output. In such embodiments, each partial phase comparator only outputs a partial phase-error result if a transition has occurred on the respective sub-channel. A summation circuit 320 receives each partial phase error signal and generates a composite phase error signal that is filtered by the loop filter 330 (which may be a low-pass filter (LPF) to provide a low-frequency error signal) to the voltage controlled oscillator (VCO) 340. The clock recovery circuit 300 may further include a frequency divider 350 that receives the outputs of the VCO 340, divides the frequency down, and provides the signals to the phase interpolator 360, which provides interpolated signals to the phase comparators 310. As shown, the phase interpolator also receives a phase offset correction signal from clock/data phase control logic 370. Such a correction signal may account for process variations in the system. The outputs of the VCO 340 may be used as sampling clocks in a multi-phase system, one phase being shown in FIG. 4.

In the two-wire transitions of interest, two sub-channel results change, essentially simultaneously except for random circuit variations. Thus, two essentially identical phase error results are incorporated into the aggregate error signal during such transitions. The following algorithm captures the overall "early or late" status of the aggregate error signal, for use in correcting wire skew.

Skew Correction Algorithm

Inputs to this algorithm include the received data, i.e. the detected sub-channel results $R_0$, $R_1$, $R_2$, For purposes of explanation, they are described herein as identifying "codes", i.e. particular wire and result combinations, as previously described relative to Table I. Information from at least two consecutively received unit intervals is obtained, here called code(N) and code(N+1), along with the detected or measured skew in the form of a clock phase error associated with that time interval, which may be a signed magnitude indicating the amount that the received transitions were earlier or later than the expected clock time, or as little as a simple binary sign indicating "early/late". Thus, in two consecutively received unit intervals in which one or more of the detected sub-channel results transition, such transitions include information for generating a composite skew measurement signal corresponding to an aggregation of skew on one or more wires undergoing a signal transmission change on the multi-wire bus.

The information may be obtained by continuous observation of the received data stream (as one example, using a finite state machine,) or may be obtained by statistically valid sampling of the data stream (as one example, by a software process running on a control or management processor periodically requesting and receiving sequences of received data, such samples spanning at minimum two consecutively received unit intervals and the associated clock phase error information.

Outputs from this algorithm are running estimates of the relative arrival times of signals on the four wires, which may be used to immediately or periodically adjust wire-specific skew values in wire signal delay elements, or request or indicate comparable per-wire timing adjustments be made by the transmitter. In one embodiment, said running estimates are immediately used to adjust receiver wire delays. In another embodiment, running estimates are maintained as variables in memory, with adjustments initiated when the absolute positive or negative magnitude of the variable exceeds a predetermined threshold, thus filtering out small perturbations.

Another embodiment of the algorithm in Verilog is provided as Appendix I. Static signed integer Wire0, Wire1, Wire2, Wire3
Calculate_skew(Data(N), Data(N+1), signed integer Error)
{
if Data(N)==7 && Data(N+1)==1||Data(N)==1 && Data (N+1)==7
    Wire0+=Error
    Wire1+=Error
    break;
else if Data(N)==0 && Data(N+1)==6||Data(N)==6 && Data(N+1)==0
    Wire0+=Error
    Wire1+=Error
    break;
else if Data(N)==7 && Data(N+1)==2||Data(N)==2 && Data(N+1)==7
    Wire0+=Error
    Wire2+=Error
    break;
else if Data(N)==0 && Data(N+1)==5||Data(N)==5 && Data(N+1)==0
    Wire0+=Error
    Wire2+=Error
    break;
else if Data(N)==2 && Data(N+1)==4||Data(N)==4 && Data(N+1)==2
    Wire2+=Error
    Wire3+=Error
    break;
else if Data(N)==5 && Data(N+1)==3 Data(N)==3 && Data(N+1)==5
    Wire2+=Error
    Wire3+=Error
    break;
else if Data(N)==1 && Data(N+1)==4 Data(N)==4 && Data(N+1)==1
    Wire1+=Error
    Wire3+=Error
    break;
else if Data(N)==6 && Data(N+1)==3||Data(N)==3 && Data(N+1)==6
    Wire1+=Error
    Wire3+=Error
    break;
else if Data(N)==1 && Data(N+1)==2||Data(N)==2 && Data(N+1)==1
    Wire1+=Error
    Wire2+=Error
    break;
else if Data(N)==6 && Data(N+1)==5||Data(N)==5 && Data(N+1)==6
    Wire1+=Error
    Wire2+=Error
    break;
else if Data(N)==7 && Data(N+1)==4||Data(N) 4 && Data (N+1)==7
    Wire0+=Error
    Wire3+=Error
    break;
else if Data(N)==0 && Data(N+1)==3||Data(N)==3 && Data(N+1)==0
    Wire0+=Error
    Wire3+=Error
    break;
}

Figure 12:
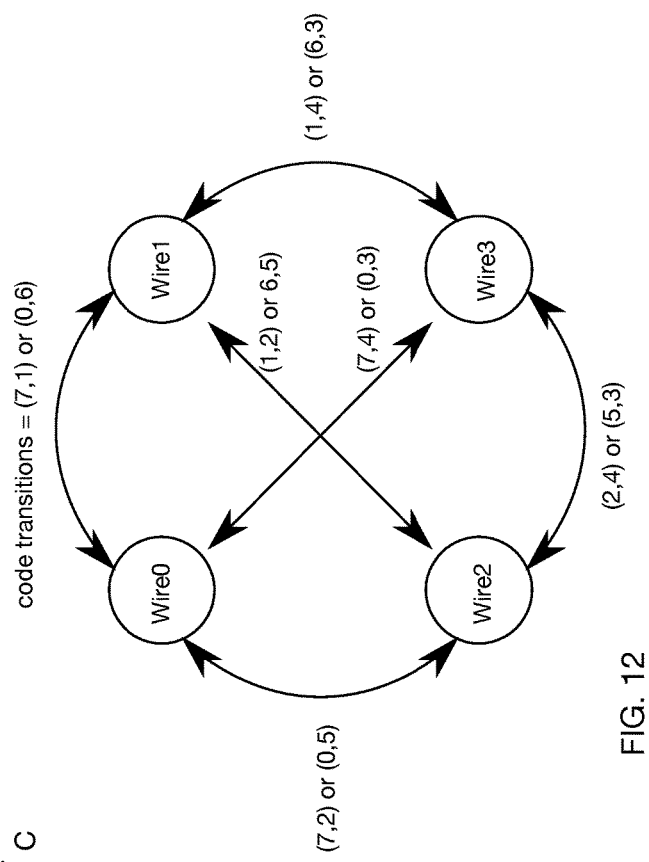
FIG. 12 is a state diagram associating particular code transitions with wire transitions.

The 'if' statements correspond exactly to the transition conditions shown in the state diagram of FIG. 12, where consecutive codes of 7 followed by 1, or of 1 followed by 7 are associated with wire0 and wire1, as are code transitions between 0 and 6.

As there is no way of determining which of the two transitioning wires is the source of the early or late timing in the composite skew measurement signal, the variables representing skew offset metrics for both wires are updated equally. If, for example, subsequent transitions associated with codes 0 and 5 also update wire0 and wire2 in the same direction, it is likely that wire0, common to both measurements, is the source of the timing error. Thus, the algorithm may be run over a number of different samples to provide a reasonable estimate of wire-specific skew values. As previously mentioned, at least one embodiment introduces an absolute magnitude threshold before accumulated timing error values cause actual timing modifications, to reduce random timing adjustments associated with these measurement artifacts. Other embodiments adjust wire timings immediately, presuming that small adjustments even in the wrong direction will introduce minimal error, while continued adjustments in the same direction will eventually produce an optimized eye opening.

FIG. 4 is a block diagram of a receiver configurable for performing the skew detection algorithm described above. As shown, FIG. 4 includes MICs 220 as described above for receiving the signals on the wires and responsively generating aggregated data signals representing the sub-channel outputs $R_0$-$R_2$. The sub-channel outputs are sampled 430, the samplers configured to provide data outputs $D_{0-2}$ for each sub-channel, as well as composite skew measurement signals including early/late indication signals $E/L_{0-2}$ for each sub-channel. In some embodiments, samplers 430 may take the form of the samplers shown in FIG. 6 or FIG. 7 as described above. FIG. 4 includes a code sequence detection block 440 for detecting valid sets of sequentially received bits (each set representing a code 0 through 7 as described above). Such sequences are illustrated in the state diagram of FIG. 12. In some embodiments, DFE may be provided by the code sequence detection block 440, which may be used by the samplers 430 in embodiments using e.g., the samplers shown in FIG. 6.

Figure 8:
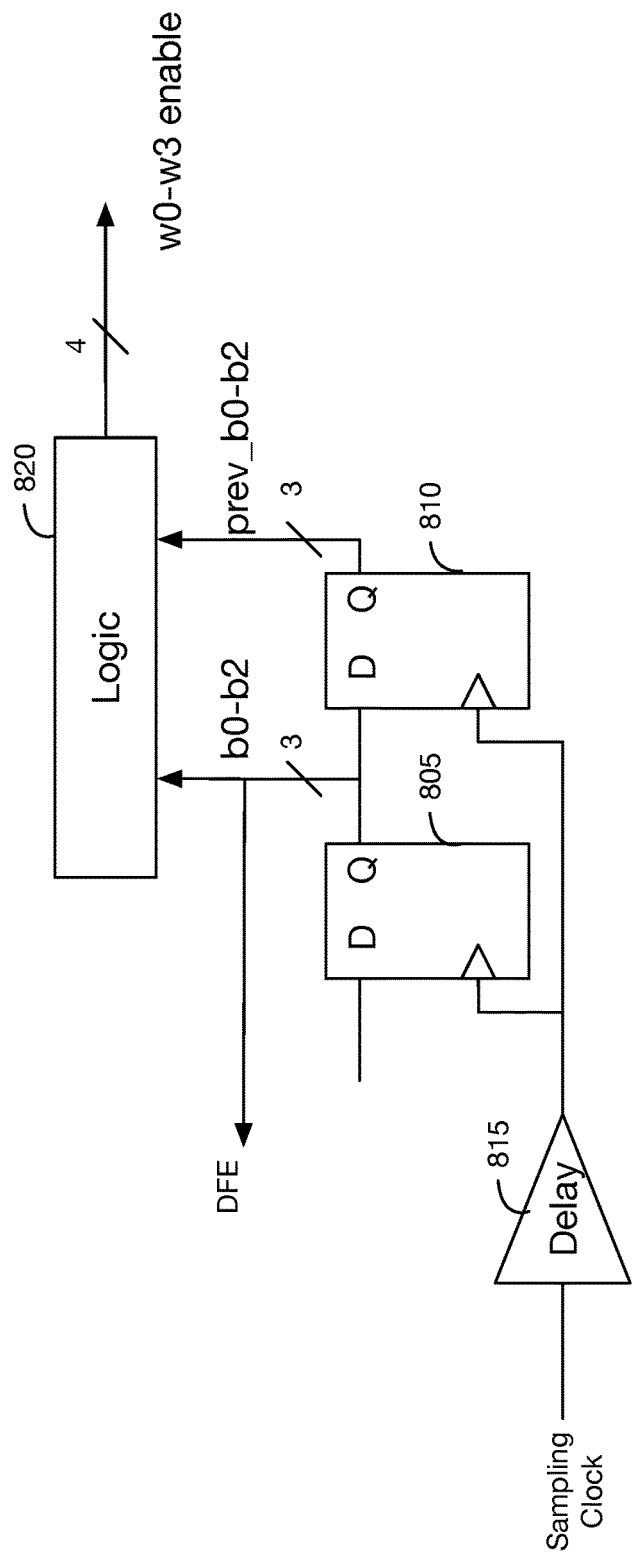
FIG. 8 is a block diagram of a code sequence detection circuit, in accordance with some embodiments.

FIG. 8 illustrates a block diagram of a code sequence detection block, in accordance with some embodiments. In some embodiments, the code sequence detection block may be implemented using D flip flops 805 and 810 being sampled by a delayed 815 version of the sampling clock to allow time for buffering. Current detected bits b0-b2 and previously detected bits prev_b0-b2 are analyzed by a logic circuit 820 to see if a valid code sequence is detected. If a valid code sequence is detected, wire delay adjustment enable signals w0-w3_enable are provided to the aggregate wire delay block 460 shown in FIG. 4. As described above, in the embodiment of the H4 code, two wires are involved in any valid code sequence detected by logic circuit 820. In such embodiments, only two of the wire delay adjustment enable signals w0-w3_enable will be '1's, while the other two are '0' (thus not updating delay values in aggregate wire delay block 460).

In alternative embodiments, other sequences may be used, in addition to or instead of the ones involving only two wires. For example, the code sequence detection circuit 670 may identify transitions where each wire changes sign, but maintains the same magnitude, such as the codeword [−1, ⅓, ⅓, ⅓] changes to [1, −⅓, −⅓, −⅓] or [−⅓, 1, −⅓, −⅓] changes to [⅓, −1, ⅓, ⅓], and so on. This set of transitions includes 8 sets of codeword sequences. In these transitions, the magnitudes of the wire-specific transitions are considered and the skew metrics are updated accordingly. In particular, skew observed or measured at the MIC output for a codeword change from [−1, ⅓, ⅓, ⅓] to [1, −⅓, −⅓, −⅓] may be weighted according to the transition magnitudes given by: abs((wire(code1, i)−wire(code2, i)*mic(wire(i)), or in this case, [2, ⅔, ⅔, ⅔]. That is, skew on wire W0 will have 3 times the impact on observed MIC output skew relative to skew on any other wire. The counter increments may be adjusted according to the identified transition magnitudes to properly reflect the relative contribution of skew from each of the wires.

Figure 9:
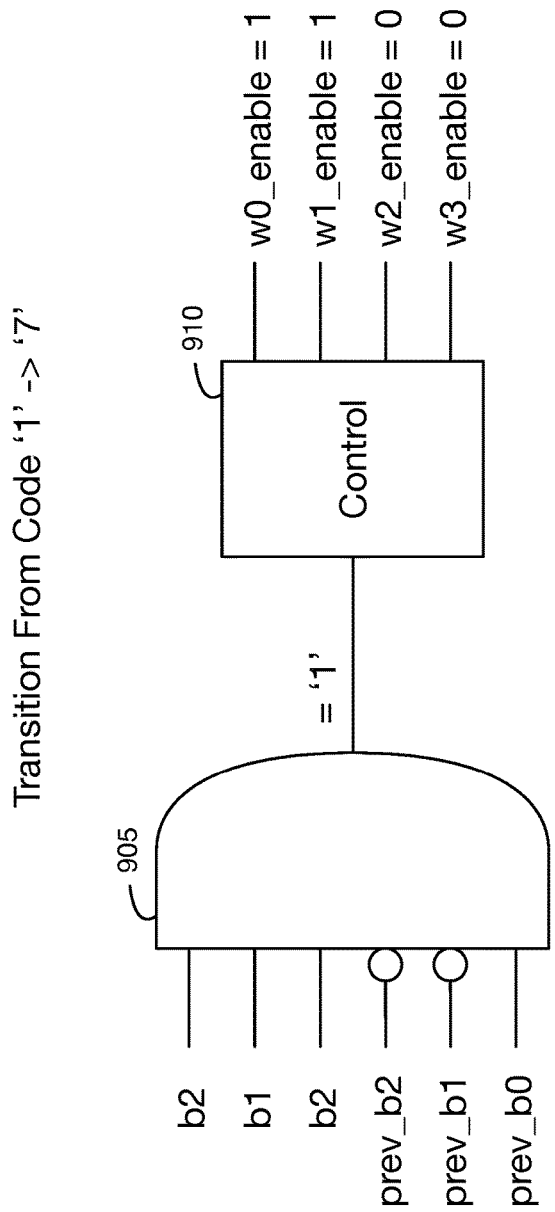
FIG. 9 is a block diagram of a logic circuit for generating wire delay adjustment enable signals, in accordance with some embodiments.

FIG. 9 illustrates a block diagram of a logic circuit 820, in accordance with some embodiments. The example of FIG. 9 illustrates the valid code sequence from code '1' in Table I to code '7'. Such a logic circuit may be implemented as an AND gate 905, in which the output of gate 905 is high if bits b0-b2 corresponding to code '1'='001' and if previously received bits prev_b0-b2 corresponding to code '7'='111'. A control circuit 910 may analyze the outputs of all such detection gates, and may output wire delay adjustment enable signals w0-w3_enable to the aggregate wire delay block 460. The enable signals indicate which counters should be adjusted (incremented or decremented according to the signal skew characteristic). In addition, the count increment may also be weighted as described herein according to the relative magnitudes of the wire signal level transitions. In some embodiments, the control circuit 910 may implement control logic that implements Table II below:

TABLE II

| Previous Bits | | | Current Bits | | | Wire Delay Adjustment Enable Signals |
|---|---|---|---|---|---|---|
| 1 | 1 | 1 | 0 | 0 | 1 | w0_enable = '1' |
| 0 | 0 | 1 | 1 | 1 | 1 | w1_enable = '1' |
| 0 | 0 | 0 | 1 | 1 | 0 | w2_enable = '0' |
| 1 | 1 | 0 | 0 | 0 | 0 | w3_enable = '0' |
| 1 | 1 | 1 | 0 | 1 | 0 | w0_enable = '1' |
| 0 | 1 | 0 | 1 | 1 | 1 | w1_enable = '0' |
| 0 | 0 | 0 | 1 | 0 | 1 | w2_enable = '1' |
| 1 | 0 | 1 | 0 | 0 | 0 | w3_enable = '0' |
| . | | | | | | |
| . | | | | | | |
| 0 | 1 | 0 | 1 | 0 | 0 | w0_enable = '0' |
| 1 | 0 | 0 | 0 | 1 | 0 | w1_enable = '0' |
| 1 | 0 | 1 | 0 | 1 | 1 | w2_enable = '1' |
| 0 | 1 | 1 | 1 | 0 | 1 | w3_enable = '1' |

FIG. 4 further includes a matrix error combiner 450 configured to receive the early/late indication signals from the plurality of sub-channels $E/L_{0-2}$, and to generate a final early/late decision to provide to aggregate wire delay block 460 to increment or decrement the stored delay values accordingly. As noted above and illustrated in Table I, in any given valid code sequence for some embodiments, only two sub-channels $R_0$-$R_2$ change. Thus, the E/L signal provided by the sub-channel that does not change is not useful, and logic may be included to omit the effects of such an indication. Nevertheless, the two sub-channels that do change will both provide E/L indications that are early or late, and thus the combination of such E/L indications will overcome the E/L indication of the non-transitioning sub-channel, and the final E/L indication provided by matrix error combiner 450 will remain valid.

Figure 10:
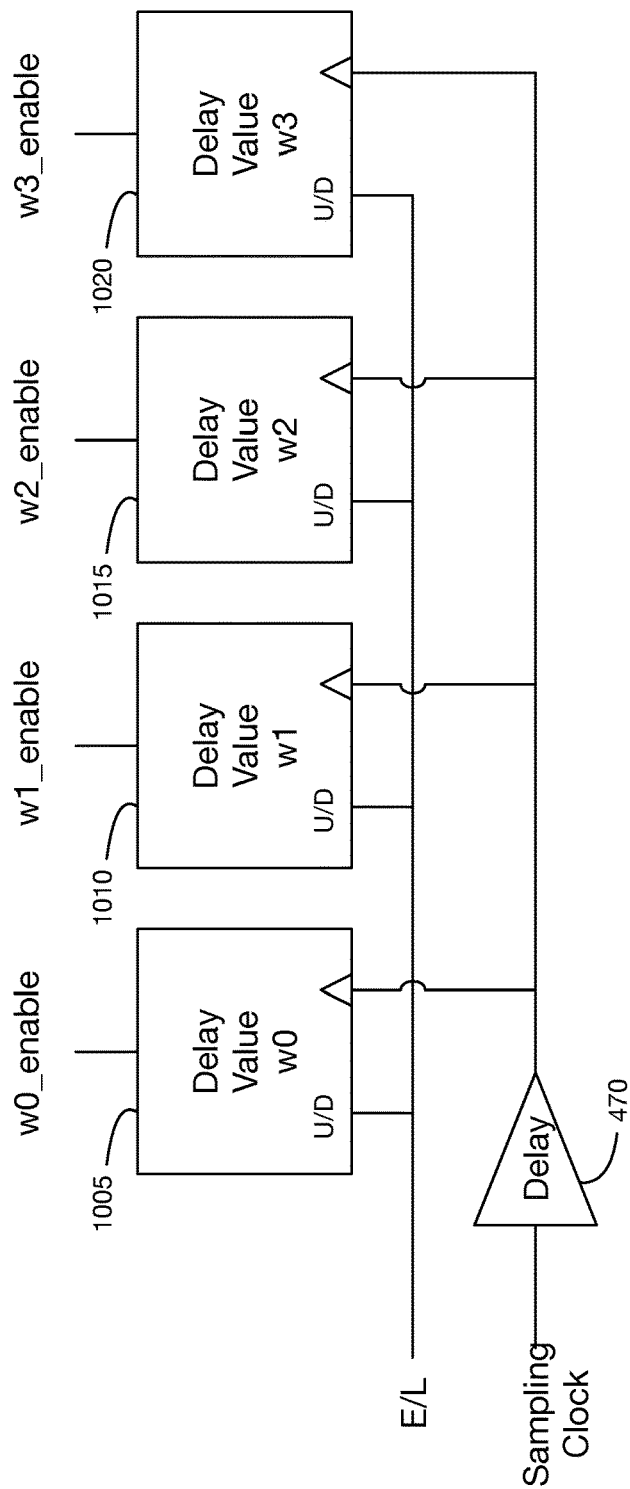
FIG. 10 is a block diagram of a circuit for aggregating wire delays, in accordance with some embodiments.

FIG. 10 illustrates an exemplary block diagram of aggregate wire delay block 460, in accordance with some embodiments. As shown, aggregate wire delay block includes four blocks 1005, 1010, 1015, and 1020; one for each wire of the multi-wire bus. In some embodiments, each block corresponds to a counter that may be selectably enabled according to the corresponding received wire delay adjustment enable signals w0-w3_enable. Each counter may also be configured to receive the E/L indication signal from the matrix error combiner 450, which may be used to control each counter to either count up or down (U/D), depending on the E/L indication signal. Each counter may increment according to a delayed 470 version of the sampling clock. In some embodiments, the values stored in each counter may be provided (e.g., as binary bits) to a respective wire delay adjustment circuit, as shown for example in FIG. 5.

Figure 13:
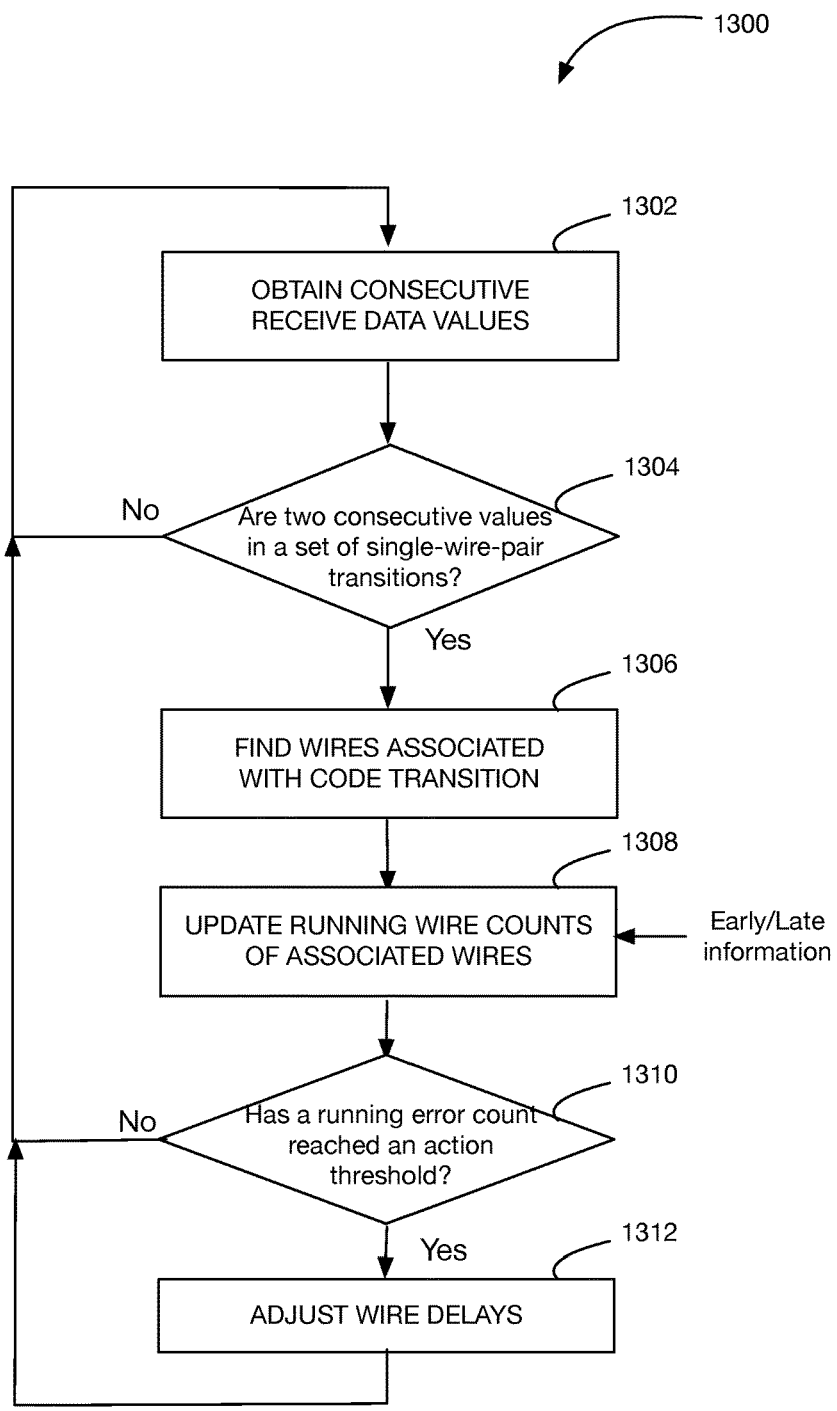
FIG. 13 is a block diagram of a method in accordance with some embodiments.

FIG. 13 illustrates a flowchart of a method 1300, in accordance with some embodiments. As shown, method 1300 includes obtaining consecutive received data values 1302. The received data values are analyzed 1304 to determine if the data corresponds to a set of single-wire-pair transitions. If the determination is "No", then the process starts again from the beginning for the next set of received data. If the determination is "Yes," the wires associated with the code transition are identified 1306, for example using control logic 910 described above with respect to Table II. Based on the identified wires, the running wire counts representing the aggregate delay values are updated 1308 based on the received E/L information. Once the running error counts reach an action threshold 1310, the wire-specific delays are adjusted according to the stored error count 1312.

The embodiments above describe correcting skew using vector signaling codes having codewords representing a combination of multiple sub-channels, the codewords being received over a multi-wire bus. It is further noted that each wire serves as an input to at least two MICs, thus the skew value of each wire may be updated using outputs of at least two different MICs, providing a uniform skew relationship across the wires of the multi-wire bus. At least one goal of the skew correction algorithm is to adjust wire-specific delay values for all wires on the multi-wire bus to provide larger eye openings at all the MICs.

Figure 14:
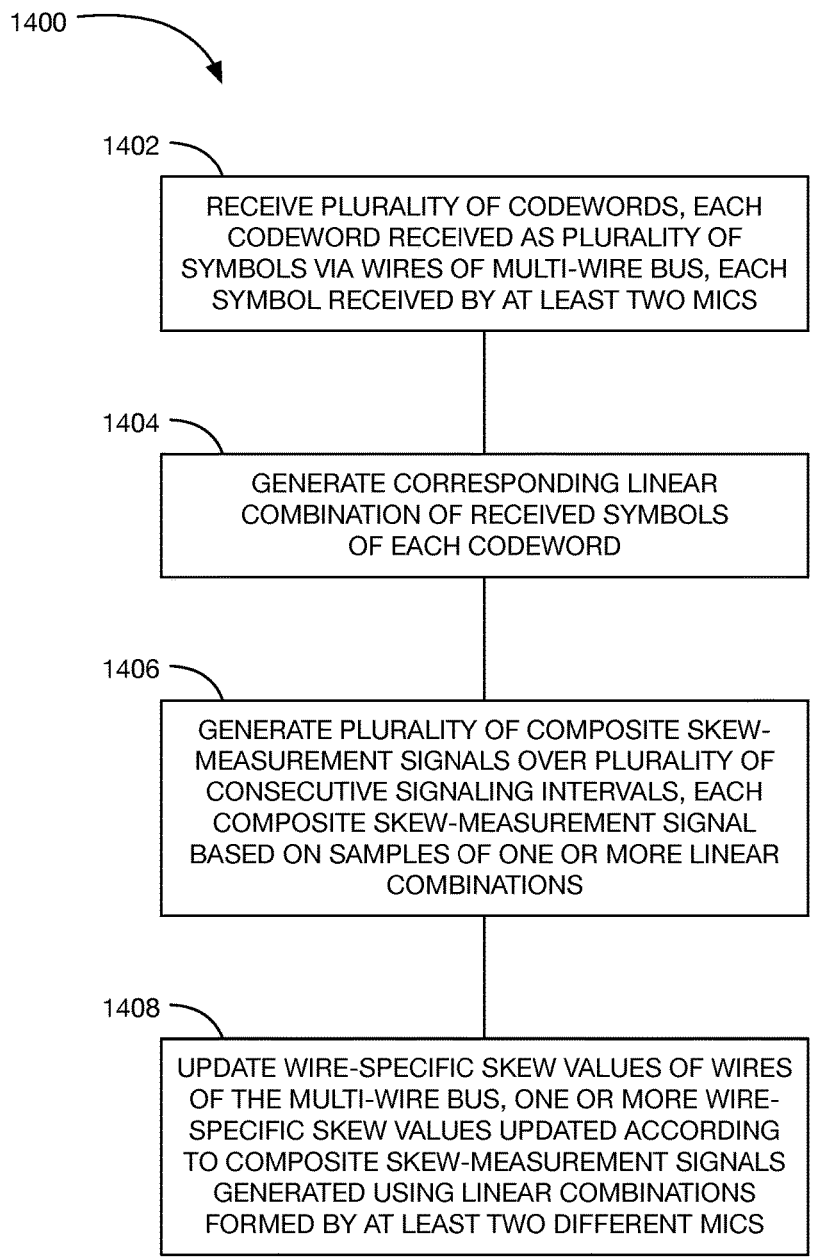
FIG. 14 is a flowchart of a method, in accordance with some embodiments.

FIG. 14 illustrates a flowchart of a method 1400, in accordance with some embodiments. As shown, method 1400 includes receiving 1402, over a plurality of consecutive signaling intervals, a plurality of codewords, each codeword received as a plurality of symbols via wires of a multi-wire bus, the plurality of symbols received at a plurality of multi-input comparators (MICs), wherein each symbol is received by at least two MICs. At 1404, a corresponding linear combination is generated for the received symbols of each codeword. A plurality of composite skew measurement signals is generated 1406 over the plurality of consecutive signaling intervals, each composite skew measurement signal based on samples of one or more linear combinations, and wire-specific skew values of the wires of the multi-wire bus are updated 1408, wherein one or more wire-specific skew values are updated according to composite skew measurement signals associated with linear combinations formed by at least two different MICs.

In some embodiments, at least one of the plurality of composite skew measurement signals corresponds to a measurement made on a single MIC, such a skew measurement signal including skew components from all wires connected to said MIC. Embodiments updating the wire-specific delay elements using a composite skew measurement signal formed from a single MIC output are given in [Hormati II].

In some embodiments, at least one of the plurality of composite skew measurement signals is generated based on linear combinations generated by at least two MICs, including skew components of all wires associated with said at least two MICs. The skew correction circuit of FIG. 4 is such an embodiment combining two or more MIC outputs.

In some embodiments, updating a wire-specific skew value of a given wire includes adjusting a capacitance associated with the given wire. In some embodiments, adjusting the capacitance comprises controlling a switched-capacitor network connected to the given wire. FIG. 5 illustrates an exemplary wire-specific delay element in which bits are used to selectably connect capacitances to the wire to adjust a delay value. In some embodiments, C0, C1, and C2 have equal capacitances and a thermometer code is used to control the capacitor, while alternatively C0, C1, and C2 may be different capacitances and B0-B2 may be configured to select eight different combinations of capacitors C0, C1, and C2. Additional or fewer capacitive elements may be include in such a circuit, three should not be considered limiting. In some embodiments, the samples of the one or more linear combinations are compared against a pre-determined offset voltage using a two-input comparator, and the composite skew measurement signal represents an early-late indication signal.

In some embodiments, the wire-specific skew values are updated in response to determining a valid codeword sequence. In such embodiments, the wire-specific skew values of the wires of the multi-wire bus may include updating wires associated with the valid codeword sequence. In some embodiments, a wire-specific skew value of a given wire is updated in response to a subset of the composite skew measurement signals generated over the plurality of consecutive unit intervals exceeding an action threshold.

In some embodiments, each linear combination is performed by a corresponding MIC of the plurality of MICs, the corresponding MIC implementing a linear combination defined by a respective sub-channel vector of a plurality of mutually orthogonal sub-channel vectors.

APPENDIX I

// VerilogA for sk, x_skewrec_avg, veriloga

```
`include "constants.vams"
`include "disciplines.vams"

module x_skewrec_avg(dm1, d0, cdrearly, cdrlate, clk, t0, t1, t2, t3, vdda, vssa);
electrical [2:0] dm1;
input [2:0] dm1;
electrical [2:0] d0;
input [2:0] d0;
electrical [2:0] cdrearly;
input [2:0] cdrearly;
electrical [2:0] cdrlate;
input [2:0] cdrlate;
electrical clk;
input clk;
electrical t0, t1,t2, t3; // outputs to control skew elements
output t0, t1, t2, t3;
electrical vdda, vssa;
inout vdda, vssa;

real t0i, t1i, t2i, t3i, vth, vote, tavg,incdecval;
integer id0, idm1;

analog begin
   vth = V(vdda, vssa) / 2.0; // digital slicer level for the votes @(initial_step) begin // just set the value to default (like a reset) at beginning of simulation
      t0i = 0.0;
      t1i = 0.0;
      t2i = 0.0;
      t3i = 0.0;
``` end

// for every clock cycle we update the skew values; this can be dutycycled as the drift is slow in mission mode. this loop was missing
@(cross(V(clk,vssa),1)) begin // Actual bits from the three bits
id0 = (V(d0[0], vssa) > vth) << 2 | (V(d0[1], vssa) > vth) << 1 | (V(d0[2], vssa) > vth) << 0;

// History bits D(n-1) across the three sub-channels
idm1 = (V(dm1[0], vssa) > vth) << 2 | (V(dm1[1], vssa) > vth) << 1 | (V(dm1[2], vssa) > vth) << 0;

// increment/decrement value, defines time constant
incdecval = 0.001p/10;

// collect all the votes across sub-channels. Two sub-channels are always toggling, one sub-channel is static and should not contribute to votes (might need to enforce to ignore the static channel. To be investigated)
vote = 0.0;
if(V(cdrearly[0],vssa) > vth)   vote = vote + incdecval;
else vote = vote - incdecval;

if(V(cdrlate[0],vssa) > vth)   vote = vote - incdecval;
else vote = vote + incdecval;

if(V(cdrearly[1],vssa) > vth)   vote = vote + incdecval;
else vote = vote - incdecval;

if(V(cdrlate[1],vssa) > vth)   vote = vote - incdecval;
else vote = vote + incdecval;

if(V(cdrearly[2],vssa) > vth)   vote = vote + incdecval;
else vote = vote - incdecval;

```
if(V(cdrlate[2],vssa) > vth)    vote = vote - incdecval;
else vote = vote + incdecval;

vote = -vote;
```

// looking for patterns where the 1 moves from one wire to an other one. -> id0 != idm1 has not been explicit defined but it is implicit as for this the votes are zero sum (to be investigated if it makes sense to add this statement for robustness).

```
if((id0 == 7 || id0 == 1 || id0 == 2 || id0 == 4) && (idm1 == 7 || idm1 == 1 || idm1 == 2 || idm1 == 4)) begin
    case (id0) // update where the 1 has ended up
        7:  t0i = t0i + vote;
        1:  t1i = t1i + vote;
        2:  t2i = t2i + vote;
        4:  t3i = t3i + vote;
        default: id0 = id0; // fake assignment
    endcase case (idm1) // update where the 1 initially was
        7:  t0i = t0i + vote;
        1:  t1i = t1i + vote;
        2:  t2i = t2i + vote;
        4:  t3i = t3i + vote;
        default: idm1 = idm1;// fake assignment
    endcase
end
```

// looking for patterns where the -1 moves from one wire to an other one. -> id0 != idm1 has not been explicit defined but it is implicit as for this the votes are zero sum (to be investigated if it makes sense to add this statement for robustness).

```
if((id0 == 0 || id0 == 6 || id0 == 5 || id0 == 3) && (idm1 == 0 || idm1 == 6 || idm1 == 5 || idm1 == 3)) begin
    case (id0) // update where the -1 has ended up
        0:  t0i = t0i + vote;
```

```
      6:  t1i = t1i + vote;
      5:  t2i = t2i + vote;
      3:  t3i = t3i + vote;
      default: id0 = id0; // fake assignment
   endcase case (idm1) // update where the -1 initially was
      0:  t0i = t0i + vote;
      6:  t1i = t1i + vote;
      5:  t2i = t2i + vote;
      3:  t3i = t3i + vote;
      default: idm1 = idm1; // fake assignment
   endcase
end // figuring out the absolute value
tavg = ( t0i + t1i + t2i + t3i ) / 4;

// and subtraction it (enforcing it to zero)
t0i = t0i - tavg;
t1i = t1i - tavg;
t2i = t2i - tavg;
t3i = t3i - tavg;

// saturation logic
if(t0i > 12.5p) t0i = 12.5p;
if(t0i < -12.5p) t0i = -12.5p;

if(t1i > 12.5p) t1i = 12.5p;
if(t1i < -12.5p) t1i = -12.5p;

if(t2i > 12.5p) t2i = 12.5p;
if(t2i < -12.5p) t2i = -12.5p;

if(t3i > 12.5p) t3i = 12.5p;
```

```
    if(t3i < -12.5p) t3i = -12.5p;

end // end of the cross function resp. clk

// assignment to the output. Will be feed into veriloga skew elements (e.g. absdelay is used to shift/delay the signal in time)
    V(t0, vssa) <+ laplace_nd(t0i + 12.5p + 5p, {1, 0}, {1, 2e-12});
    V(t1, vssa) <+ laplace_nd(t1i + 12.5p + 5p, {1, 0}, {1, 2e-12});
    V(t2, vssa) <+ laplace_nd(t2i + 12.5p + 5p, {1, 0}, {1, 2e-12});
    V(t3, vssa) <+ laplace_nd(t3i + 12.5p + 5p, {1, 0}, {1, 2e-12});

end endmodule
```

The invention claimed is:

1. A method comprising:
receiving, over a plurality of consecutive signaling intervals, a plurality of codewords, each codeword received as a plurality of symbols via wires of a multi-wire bus, the plurality of symbols received at a plurality of multi-input comparators (MICs), wherein each symbol is received by at least two MICs;
generating, for each codeword, a corresponding linear combination of the received symbols;
generating a plurality of composite skew measurement signals over the plurality of consecutive signaling intervals, each composite skew measurement signal based on samples of one or more linear combinations; and
updating wire-specific skew values of the wires of the multi-wire bus, wherein one or more wire-specific skew values are updated according to composite skew measurement signals associated with linear combinations formed by at least two different MICs.

2. The method of claim 1, wherein at least one of the plurality of composite skew measurement signals includes wire-specific skew components from all wires connected to a given MIC.

3. The method of claim 1, wherein at least one of the plurality of composite skew measurement signals is generated based on linear combinations generated by at least two MICs.

4. The method of claim 1, wherein the wire-specific skew values are updated in response to determining a valid codeword sequence.

5. The method of claim 4, wherein updating the wire-specific skew values of the wires of the multi-wire bus comprises updating wires associated with the valid codeword sequence.

6. The method of claim 1, wherein a wire-specific skew value of a given wire is updated in response to a subset of the composite skew measurement signals generated over the plurality of consecutive signaling intervals exceeding an action threshold.

7. The method of claim 1, wherein each linear combination is performed by a corresponding MIC of the plurality of MICs, the corresponding MIC implementing a linear combination defined by a respective sub-channel vector of a plurality of mutually orthogonal sub-channel vectors.

8. The method of claim 1, wherein updating a wire-specific skew value of a given wire comprises adjusting a capacitance associated with the given wire.

9. The method of claim 8, wherein adjusting the capacitance comprises controlling a switched-capacitor network connected to the given wire.

10. The method of claim 1, wherein the samples of the one or more linear combinations are made against a pre-determined offset voltage, and the composite skew measurement signal represents an early-late indication signal.

11. An apparatus comprising:
a plurality of multi-input comparators (MICs) configured to receive a plurality of codewords over a plurality of consecutive signaling intervals, each codeword received at the plurality of MICs as a plurality of symbols, each MIC configured to generate a corresponding linear combination for each received codeword;
a skew correction circuit configured to generate a plurality of composite skew measurement signals, each composite skew measurement signal formed based on one or more linear combinations generated in a single signaling interval of the plurality of consecutive signaling intervals; and
a plurality of wire-specific delay elements configured to store wire-specific delay values, each wire-specific delay value connected to a single wire of a multi-wire bus and to store a wire-specific delay value associated with said single wire, wherein one or more wire-specific delay elements are updated using composite skew measurement signals associated with linear combinations formed by at least two MICs during the plurality of consecutive signaling intervals.

12. The apparatus of claim 11, wherein at least one of the plurality of composite skew measurement signals includes wire-specific skew components from all wires connected to a given MIC.

13. The apparatus of claim 11, wherein at least one of the plurality of composite skew measurement signals is generated based on linear combinations generated by at least two MICs.

14. The apparatus of claim 11, further comprising a code sequence detection circuit configured to identify a valid codeword sequence, and wherein the plurality of wire-specific delay elements is updated in response to the identification of the valid codeword sequence.

15. The apparatus of claim 14, wherein the code sequence detection circuit is further configured to identify a subset of wires associated with the valid codeword sequence.

16. The apparatus of claim 11, wherein a wire-specific skew values of a given wire is updated in response to a subset of the composite skew measurement signals generated over the plurality of consecutive signaling intervals exceeding an action threshold.

17. The apparatus of claim 11, wherein each MIC is configured to implement the corresponding linear combination defined by a respective sub-channel vector of a plurality of mutually orthogonal sub-channel vectors.

18. The apparatus of claim 11, wherein the wire-specific delay elements are configured to adjust wire-specific delay values of a given wire by adjusting a capacitance associated with the given wire.

19. The apparatus of claim 18, wherein the wire-specific delay element comprises a switched-capacitor network connected to the given wire, the switched-capacitor network configured to control the capacitance associated with the given wire.

20. The apparatus of claim 11, wherein the one or more linear combinations are compared to a pre-determined offset voltage, and the composite skew measurement signal represents an early-late indication signal.

* * * * *